(12) United States Patent
Xu et al.

(10) Patent No.: US 11,211,946 B2
(45) Date of Patent: Dec. 28, 2021

(54) ENCODING AND DECODING TECHNIQUES

(71) Applicant: QUALCOMM Incorporated, San Diego, CA (US)

(72) Inventors: Changlong Xu, Beijing (CN); Shrinivas Kudekar, Roswell, GA (US); Thomas Richardson, South Orange, NJ (US); Joseph Binamira Soriaga, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 118 days.

(21) Appl. No.: 16/336,213

(22) PCT Filed: Jul. 11, 2017

(86) PCT No.: PCT/CN2017/092459
§ 371 (c)(1),
(2) Date: Mar. 25, 2019

(87) PCT Pub. No.: WO2018/059066
PCT Pub. Date: Apr. 5, 2018

(65) Prior Publication Data
US 2020/0021309 A1 Jan. 16, 2020

(30) Foreign Application Priority Data
Sep. 27, 2016 (CN) ................ PCT/CN2016/100311

(51) Int. Cl.
*H03M 13/00* (2006.01)
*H03M 13/09* (2006.01)
(Continued)

(52) U.S. Cl.
CPC ...... *H03M 13/095* (2013.01); *H03M 13/1111* (2013.01); *H03M 13/13* (2013.01); *H03M 13/2903* (2013.01); *H04L 1/1819* (2013.01)

(58) Field of Classification Search
None
See application file for complete search history.

(56) References Cited

U.S. PATENT DOCUMENTS 6,633,865 B1 10/2003 Liao
6,961,888 B2 11/2005 Jin et al.
(Continued)

FOREIGN PATENT DOCUMENTS

CN 1960235 A 5/2007
CN 101034953 A 9/2007
(Continued)

OTHER PUBLICATIONS

Supplementary Partial European Search Report—EP17854520—Search Authority—The Hague—dated Apr. 20, 2020.
(Continued)

*Primary Examiner* — Mujtaba M Chaudry
(74) *Attorney, Agent, or Firm* — Loza & Loza LLP

(57) ABSTRACT

Various aspects of the disclosure relate to encoding information and decoding information. In some aspects, the disclosure relates to an encoder and a decoder for Polar codes with HARQ. If a first transmission of the encoder fails, information bits associated with a lower quality channel may be retransmitted. At the decoder, the resulting decoded retransmitted bits may be used to decode the first transmission by substituting the retransmitted bits for the original corresponding (low quality channel) bits. In some aspects, to decode the first transmission, soft-combining is applied to the decoded retransmitted bits and the original corresponding (low quality channel) bits. In some aspects, CRC bits for a first transmission may be split between a first subset of bits and a second subset of bits. In this case, the second subset of bits and the associated CRC bits may be used for a second transmission (e.g., a retransmission).

22 Claims, 17 Drawing Sheets

(51) Int. Cl.
*H03M 13/11* (2006.01)
*H03M 13/13* (2006.01)
*H03M 13/29* (2006.01)
*H04L 1/18* (2006.01)

(56) References Cited

U.S. PATENT DOCUMENTS

| | | | |
|---|---|---|---|
| 7,133,853 | B2 | 11/2006 | Richardson et al. |
| 7,552,097 | B2 | 6/2009 | Richardson et al. |
| 7,627,801 | B2 | 12/2009 | Jin et al. |
| 8,271,842 | B2 | 9/2012 | Nagaraja |
| 8,751,902 | B2 | 6/2014 | Jin et al. |
| 8,780,694 | B2 | 7/2014 | Bai et al. |
| 2005/0213536 | A1 | 9/2005 | Virtanen et al. |
| 2008/0077837 | A1* | 3/2008 | Lohr ............ H04L 1/18 714/748 |
| 2009/0249155 | A1 | 10/2009 | Mayrench et al. |
| 2011/0022916 | A1* | 1/2011 | Desai ............ H04L 9/0662 714/748 |
| 2012/0254682 | A1* | 10/2012 | Wan ............. H04L 1/1845 714/748 |
| 2013/0223485 | A1 | 8/2013 | Bai et al. |
| 2014/0140336 | A1* | 5/2014 | Callard ......... H04L 25/0202 370/343 |
| 2014/0241269 | A1 | 8/2014 | Smee et al. |
| 2015/0249977 | A1* | 9/2015 | Tong ........... H04W 72/0406 370/328 |
| 2016/0182187 | A1 | 6/2016 | Kim et al. |
| 2016/0226643 | A1 | 8/2016 | Mallik et al. |

FOREIGN PATENT DOCUMENTS

| | | |
|---|---|---|
| CN | 101340271 A | 1/2009 |
| CN | 101499876 A | 8/2009 |
| CN | 103281166 A | 9/2013 |
| CN | 104038234 A | 9/2014 |
| CN | 105743621 A | 7/2016 |
| CN | 105900365 A | 8/2016 |
| JP | 2010057175 A | 3/2010 |
| TW | 201212580 A | 3/2012 |
| TW | 201616828 A | 5/2016 |
| WO | 2009151468 A1 | 12/2009 |

OTHER PUBLICATIONS

International Search Report and Written Opinion—PCT/CN2017/092459—ISA/EPO—dated Sep. 28, 2017.
International Search Report and Written Opinion—PCT/CN2016/100311—ISA/EPO—dated May 24, 2017.
MacKay D.J.C., "Good Error-Correcting Codes Based on Very Sparse Matrices," IEEE Transactions on Information Theory, Mar. 1999, vol. 45 (2), pp. 399-431.
Roth C., et al., "A 15.8 pJ/bit/iter Quasi-Cyclic LDPC Decoder for IEEE 802.11n in 90 nm CMOS," IEEE Asian Solid-State Circuits Conference, Nov. 8-10, 2010, 4 pages.
Zhang Z., et al., "An Efficient 10GBASE-T Ethernet LDPC Decoder Design With Low Error Floors," IEEE Journal of Solid-State Circuits, Apr. 2010, vol. 45 (4), pp. 843-855.
Supplementary European Search Report—EP17854520—Search Authority—The Hague—dated Jul. 29, 2020.
ASUSTeK: "Reducing Transmission Control Signalling with Bit Correlation (BC)" 3GPP Draft, 3GPP TSG-RAN WG1 #47bis, R1-070175, Jan. 15-19, 2007, Sorrento, Italy, pp. 1-7.
Taiwan Search Report—TW106131514—TIPO—dated Aug. 17, 2021.

* cited by examiner

ENCODING AND DECODING TECHNIQUES

CROSS-REFERENCE TO RELATED APPLICATION(S)

This application is the U.S. national stage of PCT patent application number PCT/CN2017/092459 filed on Jul. 11, 2017, which claims priority to and the benefit of PCT patent application number PCT/CN2016/100311 filed on Sep. 27, 2016, the content of each of which is incorporated herein by reference.

INTRODUCTION

Various aspects described herein relate to communication, and more particularly but not exclusively, to encoding information and decoding information.

A wireless communication system may use error correcting codes to facilitate reliable transmission of digital messages over noisy channels. A block code is one type of error correcting code. In a typical block code, an information message or sequence is split up into blocks, and an encoder at the transmitting device mathematically adds redundancy to the information message. Exploitation of this redundancy in the encoded information message improves the reliability of the message, enabling correction for bit errors that may occur due to the noise. That is, a decoder at the receiving device can take advantage of the redundancy to reliably recover the information message even though bit errors may occur, in part, due to the addition of noise by the channel. Examples of error correcting block codes include Hamming codes, Bose-Chaudhuri-Hocquenghem (BCH) codes, and turbo codes among others. Many existing wireless communication networks utilize such block codes, such as 3GPP LTE networks, which utilize turbo codes, and IEEE 802.11n Wi-Fi networks.

To further improve communication performance (e.g., in wireless communication systems), a retransmission scheme such a hybrid automatic repeat request (HARQ) scheme may be used. In a HARQ scheme, coded blocks are retransmitted if the first transmission is not decoded correctly. In some cases, several retransmissions may be needed to achieve a desired level of communication performance. As a result, the overhead associated with a HARQ scheme may be relatively high. Accordingly, there is a need for error correction techniques that can provide a high level of performance (e.g., with low overhead).

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

In one aspect, the disclosure provides an apparatus configured for communication that includes a memory and a processor coupled to the memory. The processor and the memory are configured to: decode a first set of bits from a first transmission, wherein the first set of bits corresponds to a first subset of bits and a second subset of bits; receive a second transmission associated with the first transmission, the second transmission including a second set of bits without cyclic redundancy check (CRC) information, and the second set of bits corresponding to the second subset of bits; decode the second set of bits; and decode the first set of bits using the decoded second set of bits.

Another aspect of the disclosure provides a method for communication including: decoding a first set of bits from a first transmission, wherein the first set of bits corresponds to a first subset of bits and a second subset of bits; receiving a second transmission associated with the first transmission, the second transmission including a second set of bits without cyclic redundancy check (CRC) information, and the second set of bits corresponding to the second subset of bits; decoding the second set of bits; and decoding the first set of bits using the decoded second set of bits.

Another aspect of the disclosure provides an apparatus configured for communication. The apparatus including: means for decoding a first set of bits from a first transmission, wherein the first set of bits corresponds to a first subset of bits and a second subset of bits; and means for receiving a second transmission associated with the first transmission, the second transmission including a second set of bits without cyclic redundancy check (CRC) information, and the second set of bits corresponding to the second subset of bits, wherein the means for decoding is configured to decode the second set of bits and to further decode the first set of bits using the decoded second set of bits.

Another aspect of the disclosure provides a non-transitory computer-readable medium storing computer-executable code, including code to: decode a first set of bits from a first transmission, wherein the first set of bits corresponds to a first subset of bits and a second subset of bits; receive a second transmission associated with the first transmission, the second transmission including a second set of bits without cyclic redundancy check (CRC) information, and the second set of bits corresponding to the second subset of bits; decode the second set of bits; and decode the first set of bits using the decoded second set of bits.

In one aspect, the disclosure provides an apparatus configured for communication that includes a memory and a processor coupled to the memory. The processor and the memory are configured to: decode a first set of bits from a first transmission, wherein the first set of bits corresponds to a first subset of bits and to a second subset of bits that includes cyclic redundancy check (CRC) information; receive a second transmission associated with the first transmission, the second transmission including a second set of bits with the CRC information, and the second set of bits corresponding to the second subset of bits; decode the second set of bits; and decode the first set of bits using the decoded second set of bits.

Another aspect of the disclosure provides a method for communication including: decoding a first set of bits from a first transmission, wherein the first set of bits corresponds to a first subset of bits and to a second subset of bits that includes cyclic redundancy check (CRC) information; receiving a second transmission associated with the first transmission, the second transmission including a second set of bits with the CRC information, and the second set of bits corresponding to the second subset of bits; decoding the second set of bits; and decoding the first set of bits using the decoded second set of bits.

Another aspect of the disclosure provides an apparatus configured for communication. The apparatus including: means for decoding a first set of bits from a first transmission, wherein the first set of bits corresponds to a first subset of bits and to a second subset of bits that includes cyclic redundancy check (CRC) information; and means for receiving a second transmission associated with the first transmission, the second transmission including a second set of bits with the CRC information, and the second set of bits corresponding to the second subset of bits, wherein the means for decoding is configured to decode the second set of bits and to further decode the first set of bits using the decoded second set of bits.

Another aspect of the disclosure provides a non-transitory computer-readable medium storing computer-executable code, including code to: decode a first set of bits from a first transmission, wherein the first set of bits corresponds to a first subset of bits and to a second subset of bits that includes cyclic redundancy check (CRC) information; receive a second transmission associated with the first transmission, the second transmission including a second set of bits with the CRC information, and the second set of bits corresponding to the second subset of bits; decode the second set of bits; and decode the first set of bits using the decoded second set of bits.

In one aspect, the disclosure provides an apparatus configured for communication that includes a memory and a processor coupled to the memory. The processor and the memory are configured to: encode a first set of bits to provide a first subset of bits including first cyclic redundancy check (CRC) information and a second subset of bits including second CRC information; transmit the encoded first set of bits; determining that a second transmission is needed; encode the second subset of bits to provide a second set of bits including the second CRC information; and transmit the second set of bits.

Another aspect of the disclosure provides a method for communication including: encoding a first set of bits to provide a first subset of bits including first cyclic redundancy check (CRC) information and a second subset of bits including second CRC information; transmitting the encoded first set of bits; determining that a second transmission is needed; encoding the second subset of bits to provide a second set of bits including the second CRC information; and transmitting the second set of bits.

Another aspect of the disclosure provides an apparatus configured for communication. The apparatus including: means for encoding a first set of bits to provide a first subset of bits including first cyclic redundancy check (CRC) information and a second subset of bits including second CRC information; means for transmitting the encoded first set of bits; and means for determining that a second transmission is needed, wherein the means for encoding is configured to encode the second subset of bits to provide a second set of bits including the second CRC information, and wherein the means for transmitting is configured to transmit the second set of bits.

Another aspect of the disclosure provides a non-transitory computer-readable medium storing computer-executable code, including code to: encode a first set of bits to provide a first subset of bits including first cyclic redundancy check (CRC) information and a second subset of bits including second CRC information; transmit the encoded first set of bits; determining that a second transmission is needed; encode the second subset of bits to provide a second set of bits including the second CRC information; and transmit the second set of bits.

These and other aspects of the disclosure will become more fully understood upon a review of the detailed description, which follows. Other aspects, features, and implementations of the disclosure will become apparent to those of ordinary skill in the art, upon reviewing the following description of specific implementations of the disclosure in conjunction with the accompanying figures. While features of the disclosure may be discussed relative to certain implementations and figures below, all implementations of the disclosure can include one or more of the advantageous features discussed herein. In other words, while one or more implementations may be discussed as having certain advantageous features, one or more of such features may also be used in accordance with the various implementations of the disclosure discussed herein. In similar fashion, while certain implementations may be discussed below as device, system, or method implementations it should be understood that such implementations can be implemented in various devices, systems, and methods.

BRIEF DESCRIPTION OF THE DRAWINGS

The accompanying drawings are presented to aid in the description of aspects of the disclosure and are provided solely for illustration of the aspects and not limitations thereof.

DETAILED DESCRIPTION

Figure 1:
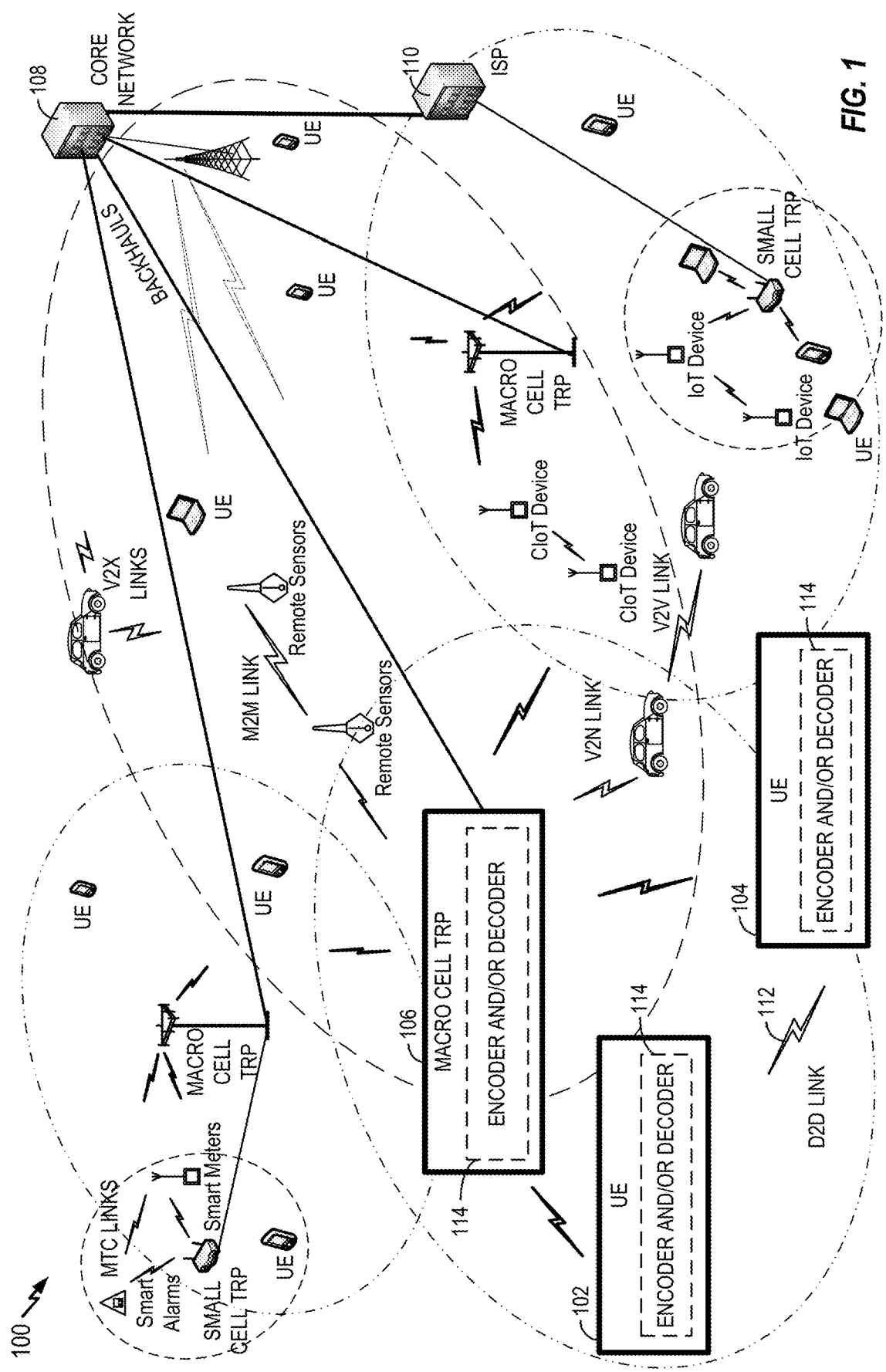
FIG. 1 is a block diagram of an example communication system in which aspects of the disclosure may be used.

Various aspects of the disclosure relate to encoding and decoding techniques. In some aspects, the disclosure relates to decoding for Polar codes with HARQ. For example, if a transmitter's first transmission fails, the transmitter retransmits information bits associated with a lower quality channel. The receiver decodes this information using an SC list (SCL) decoder. For example, the receiver may use the retransmitted decoded bits to decode the signal received in the first transmission by substituting the retransmitted bits for the original corresponding (low quality channel) bits. As another example, soft-combining of the decoded retransmitted bits and the original corresponding (low quality channel) bits may be used to decode the signal received in the first transmission. In various implementations, cyclic redundancy check (CRC) bits may be used, not used, or split (e.g., equally) between the first transmission and the second transmission. In some aspects, the disclosed techniques for list decoding of Polar codes with HARQ may improve communication performance and reduce the CRC overhead.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. Moreover, alternate configurations may be devised without departing from the scope of the disclosure. Additionally, well-known elements will not be described in detail or will be omitted so as not to obscure the relevant details of the disclosure.

The various concepts presented throughout this disclosure may be implemented across a broad variety of telecommunication systems, network architectures, and communication standards. For example, the 3rd Generation Partnership Project (3GPP) is a standards body that defines several wireless communication standards for networks involving the evolved packet system (EPS), frequently referred to as long-term evolution (LTE) networks. Evolved versions of the LTE network, such as a fifth-generation (5G) network, may provide for many different types of services or applications, including but not limited to web browsing, video streaming, VoIP, mission critical applications, multi-hop networks, remote operations with real-time feedback (e.g., tele-surgery), etc. Thus, the teachings herein can be implemented according to various network technologies including, without limitation, 5G technology, fourth generation (4G) technology, third generation (3G) technology, and other network architectures. Also, the techniques described herein may be used for a downlink, an uplink, a peer-to-peer link, or some other type of link.

The actual telecommunication standard, network architecture, and/or communication standard used will depend on the specific application and the overall design constraints imposed on the system. For purposes of illustration, the following may describe various aspects in the context of a 5G system and/or an LTE system. It should be appreciated, however, that the teachings herein may be used in other systems as well. Thus, references to functionality in the context of 5G and/or LTE terminology should be understood to be equally applicable to other types of technology, networks, components, signaling, and so on.

Example Communication System

FIG. 1 illustrates an example of a wireless communication system 100 where a user equipment (UE) can communicate with other devices via wireless communication signaling. For example, a first UE 102 and a second UE 104 may communicate with a transmit receive point (TRP) 106 using wireless communication resources managed by the TRP 106 and/or other network components (e.g., a core network 108, an internet service provider (ISP) 110, peer devices, and so on). In some implementations, one or more of the components of the system 100 may communicate with each other directedly via a device-to-device (D2D) link 112 or some other similar type of direct link.

Communication of information between two or more of the components of the system 100 may involve encoding the information. For example, the TRP 106 may encode data or control information that the TRP 106 sends to the UE 102 or the UE 104. As another example, the UE 102 may encode data or control information that the UE 102 sends to the TRP 106 or the UE 104. The encoding may involve block coding such as Polar coding. In accordance with the teachings herein, one or more of the UE 102, the UE 104, the TRP 106, or some other component of the system 100 may include an encoder and/or decoder 114 that may, for example, optionally include CRC from a first transmission in a second transmission and/or decode a first transmission based on a second transmission.

The components and links of the wireless communication system 100 may take different forms in different implementations. For example, and without limitation, UEs may be cellular devices, Internet of Things (IoT) devices, cellular IoT (CIoT) devices, LTE wireless cellular devices, machine-type communication (MTC) cellular devices, smart alarms, remote sensors, smart phones, mobile phones, smart meters, personal digital assistants (PDAs), personal computers, mesh nodes, and tablet computers.

In some aspects, a TRP may refer to a physical entity that incorporates radio head functionality for a particular physical cell. In some aspects, the TRP may include 5G new radio (NR) functionality with an air interface based on orthogonal frequency division multiplexing (OFDM). NR may support, for example and without limitation, enhanced mobile broadband (eMBB), mission-critical services, and wide-scale deployment of IoT devices. The functionality of a TRP may be similar in one or more aspects to (or incorporated into) the functionality of a CIoT base station (C-BS), a NodeB, an evolved NodeB (eNodeB), radio access network (RAN) access node, a radio network controller (RNC), a base station (BS), a radio base station (RBS), a base station controller (BSC), a base transceiver station (BTS), a transceiver function (TF), a radio transceiver, a radio router, a basic service set (BSS), an extended service set (ESS), a macro cell, a macro node, a Home eNB (HeNB), a femto cell, a femto node, a pico node, or some other suitable entity. In different scenarios (e.g., NR, LTE, etc.), a TRP may be referred to as a gNodeB (gNB), an eNB, a base station, or referenced using other terminology.

Various types of network-to-device links and D2D links may be supported in the wireless communication system 100. For example, D2D links may include, without limitation, machine-to-machine (M2M) links, MTC links, vehicle-to-vehicle (V2V) links, and vehicle-to-anything (V2X) links. Network-to-device links may include, without limitation, uplinks (or reverse links), downlinks (or forward links), and vehicle-to-network (V2N) links.

Example Communication Components

Figure 2:
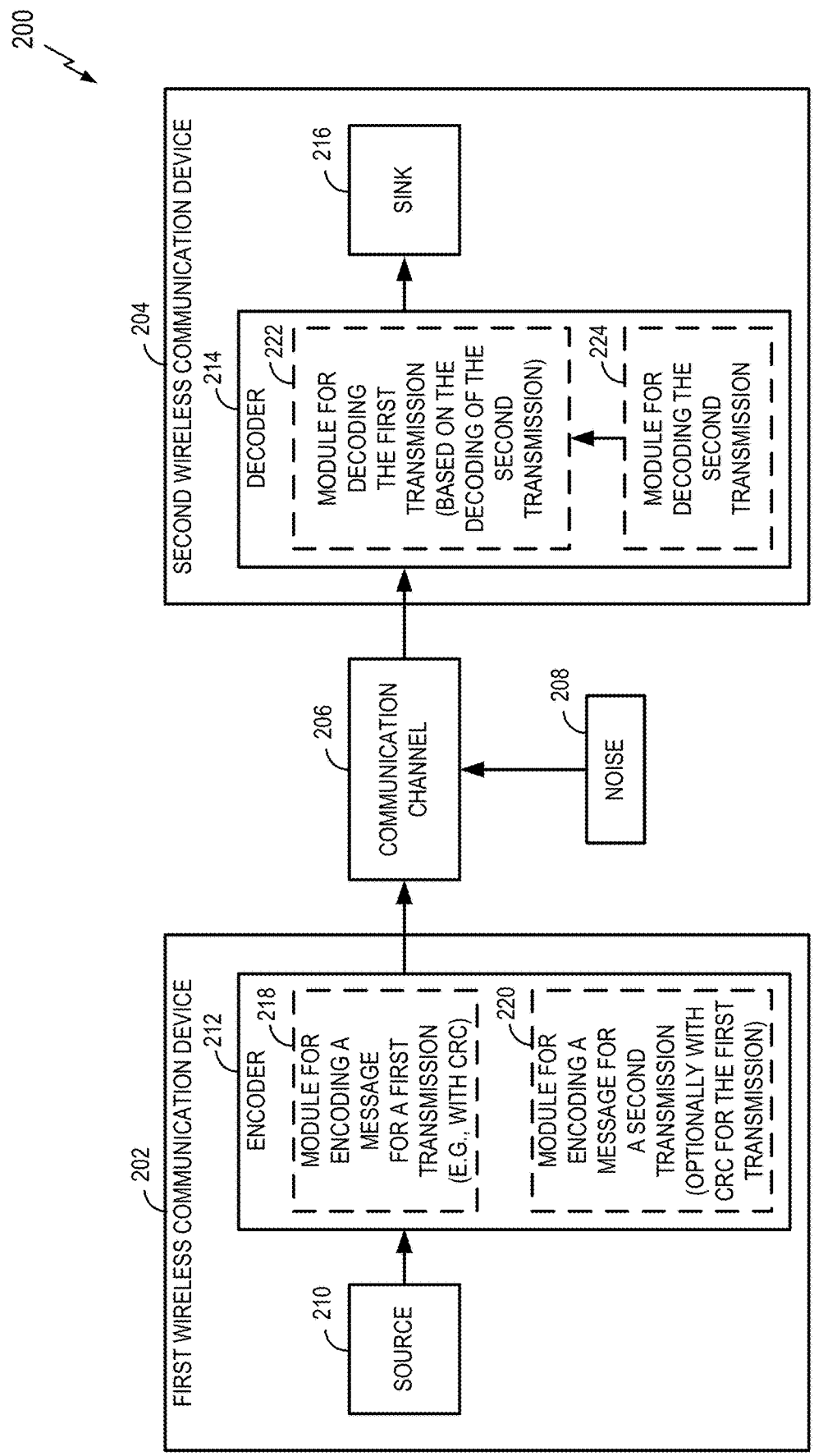
FIG. 2 is a block diagram of example communication devices in which aspects of the disclosure may be used.

FIG. 2 is a schematic illustration of a wireless communication system 200 that includes a first wireless communication device 202 and a second wireless communication device 204 that may use the teachings herein. In some implementations, the first wireless communication device 202 or the second wireless communication device 204 may correspond to the UE 102, the UE 104, the TRP 106, or some other component of FIG. 1.

In the illustrated example, the first wireless communication device 202 transmits a message over a communication channel 206 (e.g., a wireless channel) to the second wireless communication device 204. One issue in such a scheme that may be addressed to reliably communicate the message is to take into account noise 208 introduced in the communication channel 206.

Block codes or error correcting codes are frequently used to provide reliable transmission of messages over noisy channels. In a typical block code, an information message or sequence from an information source 210 at the first (transmitting) wireless communication device 202 is split up into blocks, each block having a length of K bits. An encoder 212 mathematically adds redundancy to the information message, resulting in codewords having a length of N, where N>K. Here, the code rate R is the ratio between the message length and the block length (i.e., R=K/N). Exploitation of this redundancy in the encoded information message is a key to reliably receiving the transmitted message at the second (receiving) wireless communication device 204, whereby the redundancy enables correction for bit errors that may occur due to the noise 208 imparted on the transmitted message. That is, a decoder 214 at the second (receiving) wireless communication device 204 can take advantage of the redundancy to reliably recover the information message provided to an information sink 216 even though bit errors may occur, in part, due to the addition of the noise 208 in the channel 206.

Many examples of such error correcting block codes are known to those of ordinary skill in the art, including Hamming codes, Bose-Chaudhuri-Hocquenghem (BCH) codes, and turbo codes, among others. Some existing wireless communication networks utilize such block codes. For example, 3GPP LTE networks may use turbo codes. However, for future networks, a new category of block codes, called Polar codes, presents a potential opportunity for reliable and efficient information transfer with improved performance relative to other codes.

The disclosure relates in some aspects, to the use of hybrid automatic repeat request (HARQ) with Polar codes (described below). For example, the encoder 212 may include a module for encoding a message for a first transmission 218, where the message may include cyclic redundancy check (CRC) information. A transmitter (not shown) of the first wireless communication device 202 sends the first transmission to the second wireless communication device 204.

A receiver (not shown) of the second wireless communication device 204 receives the first transmission. If the decoder 214 (e.g., a module for decoding the first transmission 222) is not able to correctly decode the first transmission, the second wireless communication device 204 may send NAK feedback (not shown) to the first wireless communication device 202.

In response to NAK feedback, the encoder 212 may encode a message for a second transmission (which may be referred to as a retransmission), where the message optionally includes at least a portion of the CRC information for the first transmission. To this end, the encoder 212 includes a module for encoding a message for a second transmission 220. The first wireless communication device 202 then sends the second transmission to the second wireless communication device 204.

The decoder 214 also includes a module for decoding the second transmission 224. In some aspects, the decoding (e.g., list decoding) for the first transmission (performed by the module for decoding the first transmission 222) may be based on the result of the decoding (e.g., list decoding) for the second transmission. For example, the decoding for the first transmission may use one or more candidate vectors generated by the decoding for the second transmission.

Figure 3:
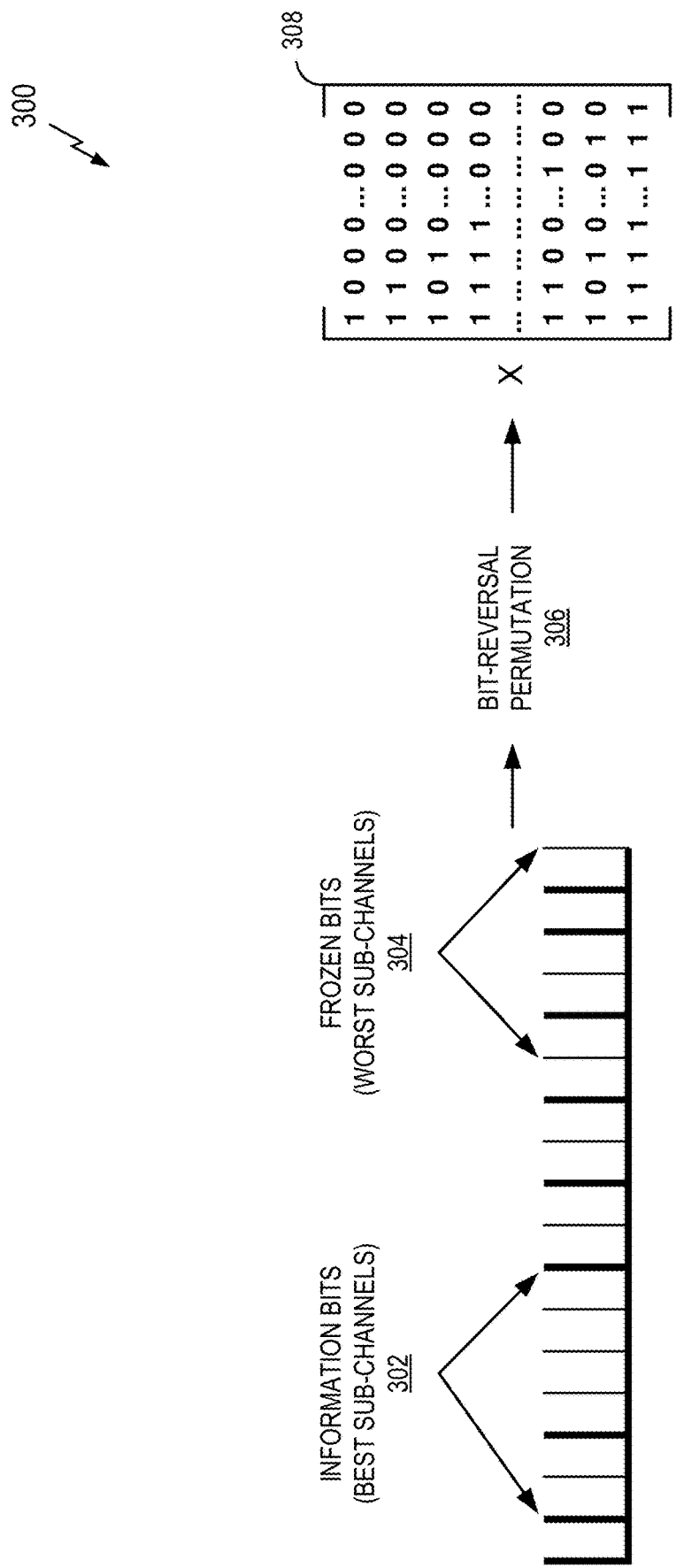
FIG. 3 is a conceptual diagram illustrating an example of encoding based on Polar codes.
Figure 4:
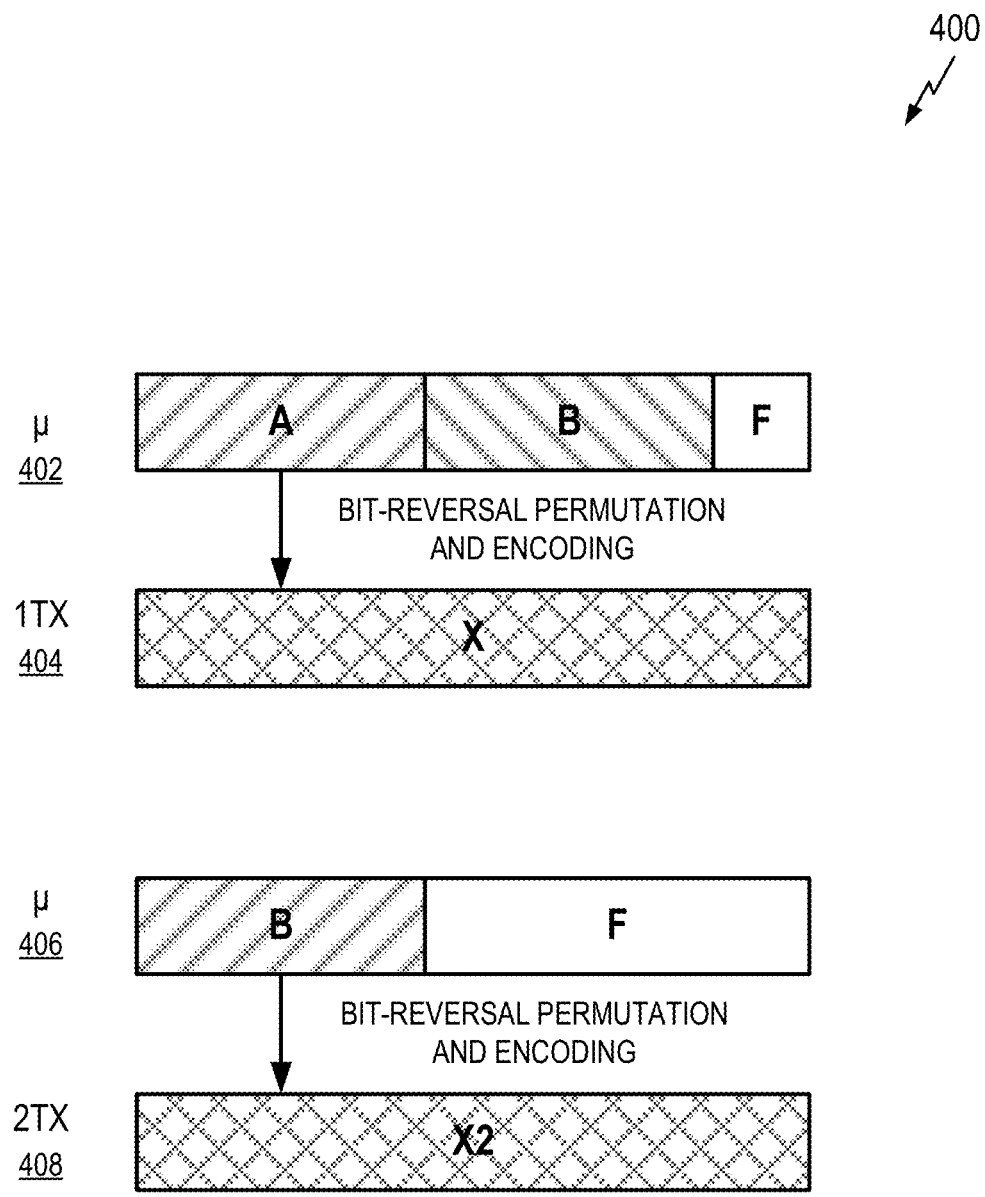
FIG. 4 is a diagram of an example hybrid automatic repeat request (HARQ) technique for Polar codes.

Turning now to FIGS. 3 and 4, several aspects of Polar codes and HARQ schemes will be described in more detail. It should be appreciated that these examples are presented for purposes of explanation and that the teachings herein may be applicable to other types of coding and retransmission schemes.

Polar Codes

Polar codes are linear block error correcting codes where channel polarization is generated with a recursive algorithm that defines polar codes. Polar codes are the first explicit codes that achieve the channel capacity of symmetric binary-input discrete memoryless channels. That is, polar codes achieve the channel capacity (the Shannon limit) or the theoretical upper bound on the amount of error-free information that can be transmitted on a discrete memoryless channel of a given bandwidth in the presence of noise. This capacity can be achieved with a simple successive cancellation (SC) decoder.

A typical encoder structure 300 of Polar codes is depicted in FIG. 3. The Polar code sub-channels are allocated into two subsets, best sub-channels and worst sub-channels, based on the corresponding error probability associated with each sub-channel. The information bits 302 are then put on the best sub-channels while frozen bits 304 (with zero values) are put on the worst sub-channels. A bit-reversal permutation 306 is used to provide the output bits of the decoder in a desired sequence. The encoding is performed after multiplying by a Hadamard matrix 308. The generator matrices of Polar codes are made up of the rows of a Hadamard matrix. The rows corresponding to low error probabilities of an SC decoder are selected for information bits while the remaining rows are for frozen bits.

It may thus be seen that the Polar codes are one type of block codes (N, K), where N is the codeword length and K is the number of information bits. With polar codes, the codeword length N is a power-of-two (e.g., 256, 512, 1024, etc.) because the original construction of a polarizing matrix is based on the Kronecker product of $$\begin{bmatrix} 1 & 0 \\ 1 & 1 \end{bmatrix}.$$

HARQ

HARQ incremental redundancy (HARQ-IR) schemes are widely used in wireless communication systems to improve transmission efficiency. In a HARQ scheme, the coded blocks will be retransmitted if the first transmission is not decoded correctly. The maximum number of transmissions in a typical application is 4. However, some applications may use a different retransmission limit.

An example of a HARQ-IR scheme 400 for Polar codes is depicted in FIG. 4. For simplification, only a first transmission and a second transmission (a retransmission) are shown. In the μ domain 402 of the first transmission, the information bits are allocated into two sub-blocks denoted as A and B. The F block is for frozen bits with a value of zero. After bit-reversal permutation and encoding, a coded block in the X domain is obtained. If the first transmission (1TX) 404 is decoded correctly at the receiver, the transmission ends.

However, if the first transmission (1TX) 404 is not decoded correctly, the transmitter will generate a new codeword in the μ domain 406 with B information bits. After bit-reversal permutation and encoding, the transmitter invokes a second transmission (2TX) 408 to send a corresponding coded block in the X2 domain. If the receiver does not decode the B information for the second transmission (2TX) 408 correctly, a third transmission may be invoked, and so on.

If the B information in the second transmission (2TX) 408 is decoded correctly by the receiver, the B information in first transmission will be set as frozen bits and the A information in first transmission will be decoded accordingly. In this case, this is equivalent to obtaining the low rate for the A information in the first transmission.

From a performance standpoint, the algorithm of FIG. 4 may be equivalent to existing (e.g., non-Polar coding) HARQ-IR schemes in terms of coding gain. In FIG. 4, the equivalent coding rate after two transmissions is half of the first transmission with a block size of the first transmission.

CA-SCL Decoding

Figure 5:
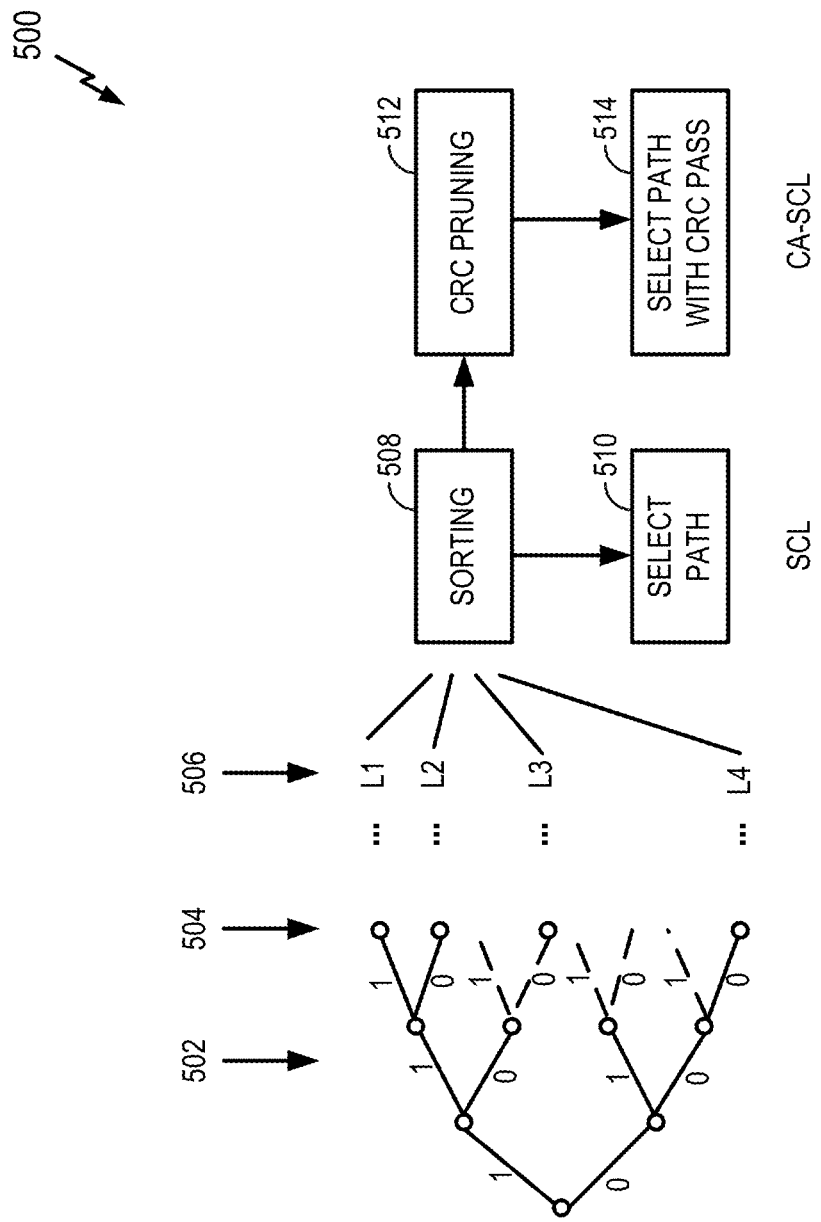
FIG. 5 is a diagram of an example structure of a CRC-aided SCL decoder.

FIG. 5 depicts an example structure 500 of a CRC-aided SCL (CA-SCL) decoder. For simplification, a list size of 4 is assumed and all bits are unfrozen. Other configurations (e.g., different list sizes) could be used in other implementations. In the path structure 502 of FIG. 5, there are at most 4 nodes with paths that continue downward at each level. At the initial stage, the first unfrozen bit can be either 0 or 1 and two paths are obtained. Then, the second unfrozen bit can be either 0 or 1 and two paths are generated for each. Thus, there are a total of 4 paths and, since there are not more than 4 paths, it is not necessary to prune the paths. However, there are 8 decoding paths 504 for the third unfrozen bits. Thus, the 8 paths are pruned into the 4 most promising paths since the list size is set to 4. For the following unfrozen bits, the 4 active paths will continue to double to 8 paths and the 8 paths will be pruned to the 4 best paths again. In this way, there are only 4 active paths 506 which are kept to the last unfrozen bits. Finally, the 4 candidate paths 506 will be sorted 508 and the best path will be selected 510 as a decision for the SCL algorithm. To further improve the performance, CRC pruning 512 can be used whereby CRC is used to check the candidate paths, and the path with CRC passing will be selected 514. In this algorithm of CA-SCL, CRC may be checked from the best candidate paths to the worse candidate paths.

List Decoding for Polar Codes with HARQ

The disclosure relates in some aspects to a decoding algorithm that uses list decoding for Polar codes with HARQ. Three techniques are described. The first two techniques are for single CRC while the third technique is for split CRC. For simplification, the following describes a scenario with the maximum number of transmissions equal to 2. It should be appreciated, however, that the techniques taught herein are applicable to different numbers of transmissions (e.g., 3, 4, or more).

List Decoding Using Single CRC for Polar Codes with HARQ

Figure 6:
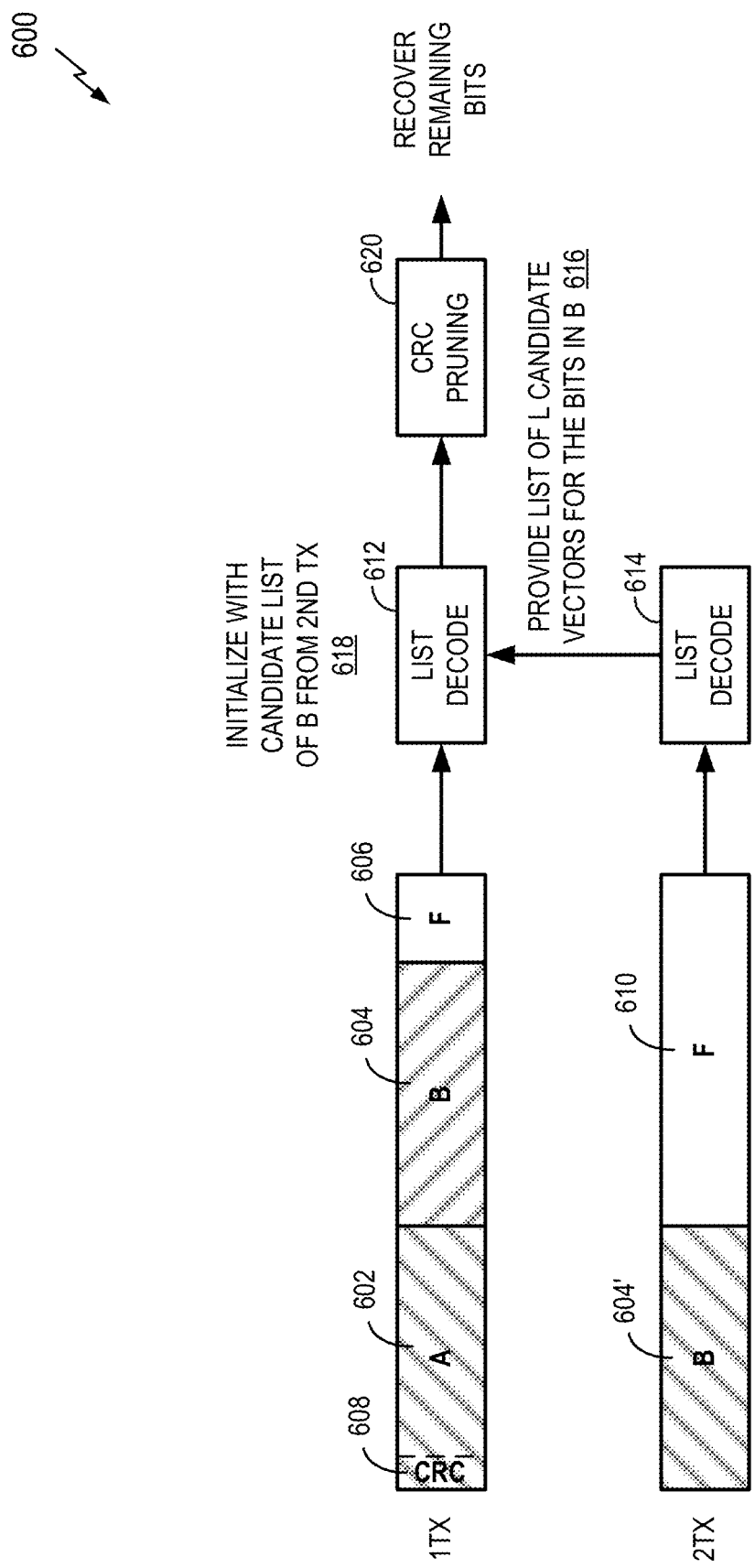
FIG. 6 is a diagram of an example of list decoding using single CRC for Polar codes with HARQ in accordance with some aspects of the disclosure.

An example decoder 600 using single CRC for Polar codes with HARQ is depicted in FIG. 6. In the decoder 600, the bits of a first received transmission (1TX) include a first subset of bits A 602, a second subset of bits B 604, frozen bits F 606, and CRC bits 608. The bits of a received second transmission (2TX) include the second subset of bits B 604' and frozen bits F 610. The CRC bits 608 are included in the first transmission (1TX) but not in the second transmission (2TX) to reduce the CRC overhead.

To decode the first transmission, the decoder 600 uses a CRC-aided SCL decoding algorithm 612. If the result is not correct, a second transmission (e.g., a retransmission) will be initiated (e.g., via a HARQ process). In this case, a transmitter (not shown in FIG. 6) will encode and transmit the information bits of block B for the second transmission (received at the decoder 600 as block B 604').

The decoder 600 uses SCL decoding 614 to decode the received signal for the second transmission. The output L candidate vectors 616 for the bits of block B 604' are then provided to the decoding algorithm 612 for final decoding of the signal received in the first transmission. For example, the bits of block B 604 for the first transmission may be initialized with 618 (e.g., replaced with) the list of L candidate vectors 616 from the second transmission. For each candidate vector, CRC may be applied for pruning 620 the candidate paths obtained in the SCL decoder. Via this process, the bits of block A may be recovered such that the signal received in the first transmission is thereby decoded.

List Decoding Using Single CRC for Systematic Polar Codes with HARQ

Figure 7:
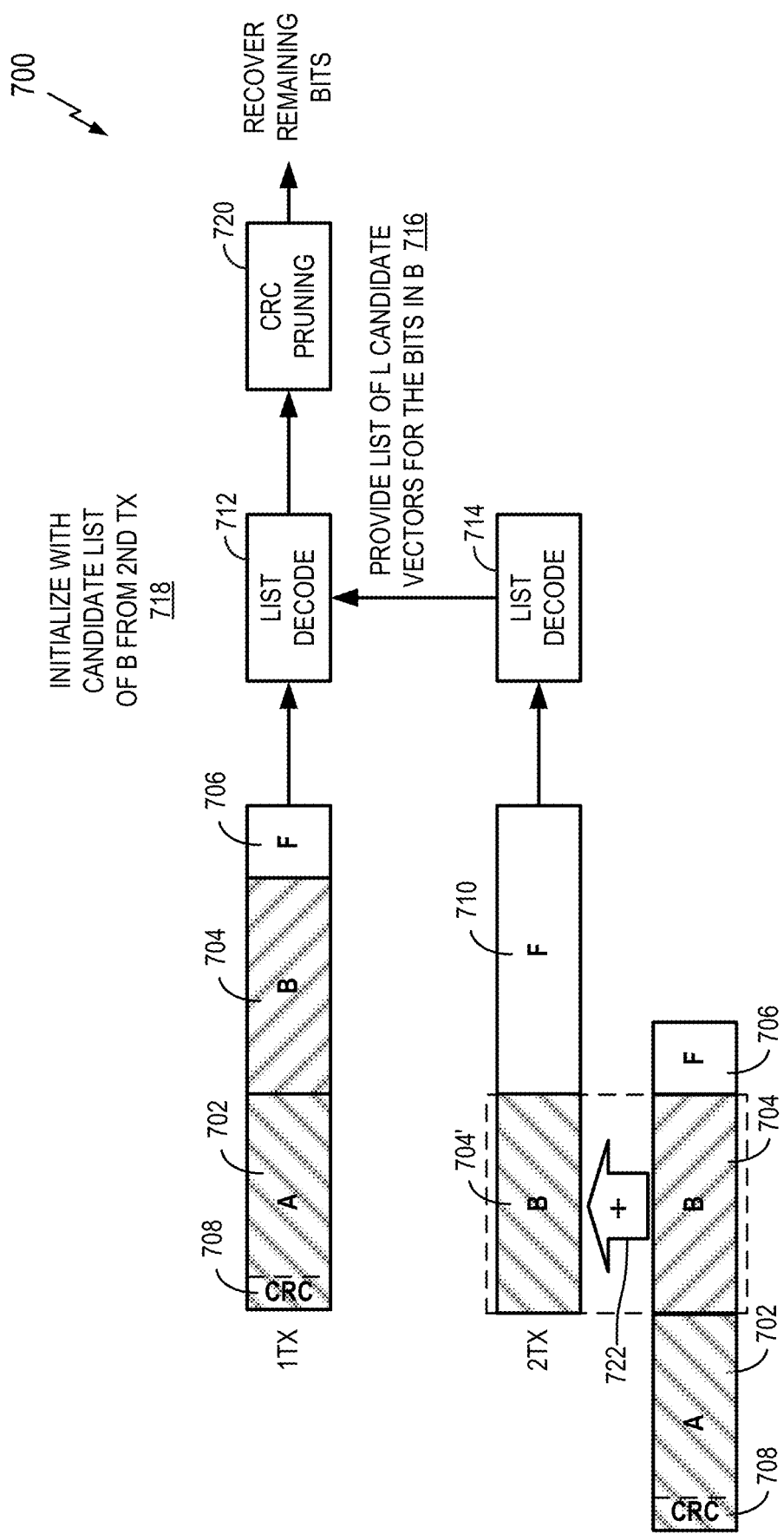
FIG. 7 is a diagram of an example of list decoding using single CRC for systematic Polar codes with HARQ in accordance with some aspects of the disclosure.

An example decoder 700 that uses single CRC for systematic Polar codes with HARQ is depicted in FIG. 7. In the decoder 700, the bits of a first received transmission (1TX) include a first subset of bits A 702, a second subset of bits B 704, frozen bits F 706, and CRC bits 708. The bits of a received second transmission (2TX) include the second subset of bits B 704' and frozen bits F 710. The CRC bits 708 are included in the first transmission (1TX) but not in the second transmission (2TX) to reduce the CRC overhead.

To decode the first transmission, the decoder 700 uses a CRC-aided SCL decoding algorithm 712. If the result is not correct, a second transmission (e.g., a retransmission) will be initiated (e.g., via a HARQ process). In this case, a transmitter (not shown in FIG. 7) will encode and transmit the information bits of block B for the second transmission (received at the decoder 700 as block B 704').

Because a systematic code is generated in both the first transmission and the second transmission, the decoder 700 can use soft-combining 722 of the log-likelihood ratio (LLR) of the bits in block B of both the first transmission (block B 704) and the second transmission (block B 704'). The decoder 700 uses SCL decoding 714 to decode the combined received signal for the second transmission (after the soft-combining). The performance of the SCL decoding 714 may thus be improved by the soft-combining. The output L candidate vectors 716 for the bits in B are then provided to the decoding algorithm 712 for final decoding of the signal received in the first transmission. For example, each bit in B in the first transmission may be initialized 718 with the L candidate list from the second transmission. For each candidate vector, CRC will be applied for pruning 720 the candidate paths obtained in the SCL decoder. Via this process, the bits of block A may be recovered such that the signal received in the first transmission is thereby decoded.

List Decoding Using Split CRC for Polar Codes with HARQ

Figure 8:
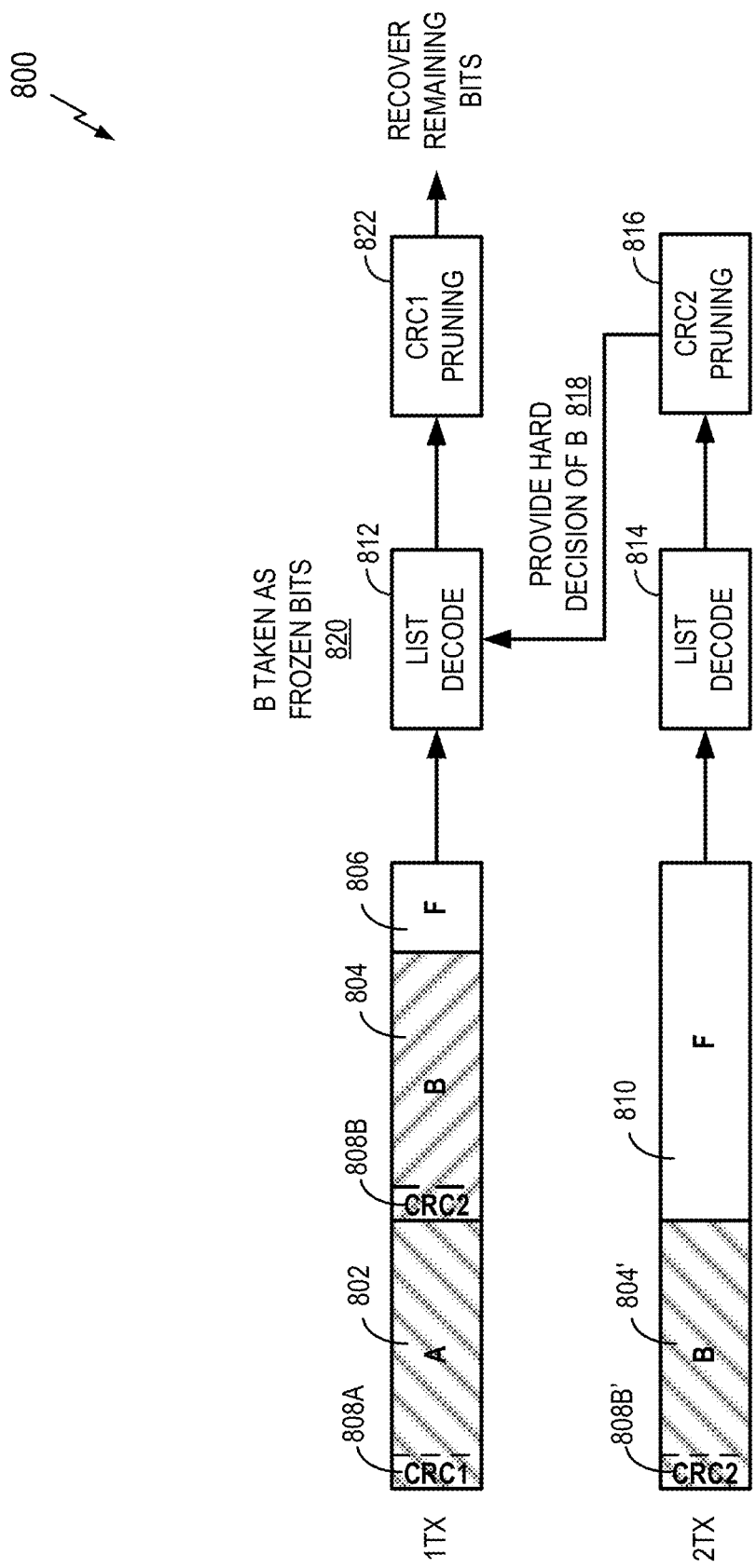
FIG. 8 is a diagram of an example of list decoding using split CRC for Polar codes with HARQ in accordance with some aspects of the disclosure.

An example decoder 800 that uses split CRC for Polar codes with HARQ is depicted in FIG. 8. In this case, CRC bits are split (e.g., equally) between a first subset of bits A 802 and a second subset of bits B 804. Thus, in the decoder 800, the bits of a first received transmission (1TX) include the first subset of bits A 802, the second subset of bits B 804, frozen bits F 806, CRC1 808A of the first subset of bits A 802, and CRC2 808B of the second subset of bits B 804. For the first transmission, the decoder 800 applies a CRC-aided SCL decoding algorithm 812 that uses CRC1 808A and CRC2 808B. If the result is not correct, the second transmission will be requested (e.g., via a HARQ process). Consequently, the transmitter (not shown in FIG. 8) will encode and transmit the information bits of block B (received at the decoder 800 as block B 804'). Because the bits of CRC2 are included in the second transmission in this case (received at the decoder 800 as CRC2 808B'), CRC2 bits can be used to prune 816 the candidate paths from the SCL decoding algorithm 814 for the second transmission. If no candidate path passes the CRC2 check, the best path will be selected as the hard decision 818 for block B. This path will then be provided to the decoding algorithm 812 for final decoding of the signal received in first transmission. In this case, the bits in B in the first transmission will be taken as frozen bits 820 when the received signal in first transmission is decoded. In addition, the CRC1 will be applied for pruning the candidate paths 822 obtained in SCL decoder for the first transmission. Via this process, the bits of block A may be recovered such that the signal received in the first transmission is thereby decoded.

Example Encoder

Figure 9:
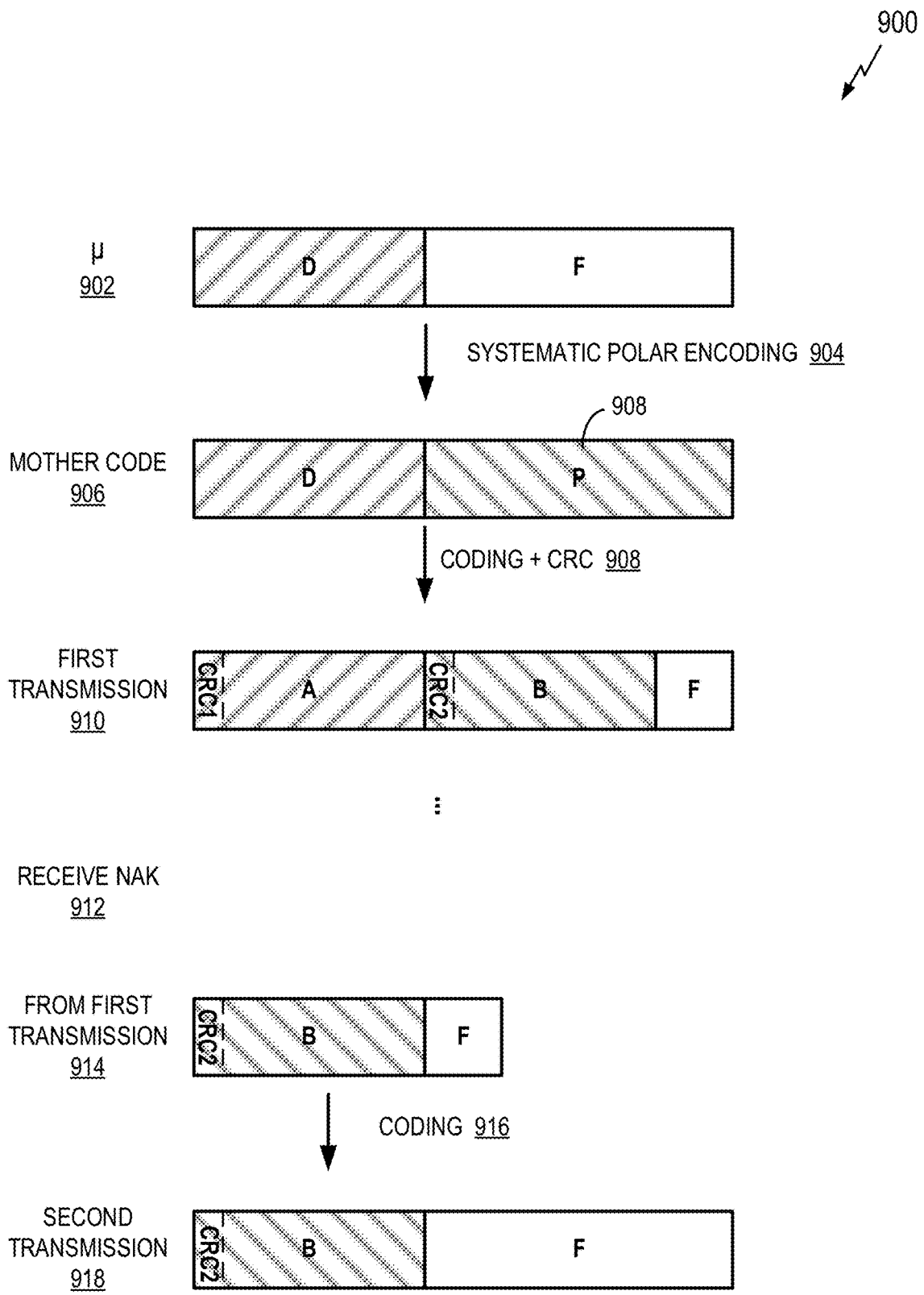
FIG. 9 is a diagram of an example of Polar encoding using split CRC with HARQ in accordance with some aspects of the disclosure.

FIG. 9 depicts an example encoder 900 that uses HARQ with Polar Codes in accordance with the teachings herein. In some aspects, the encoder 900 may be used to provide the encoded information used by the decoder 800 of FIG. 8. In the μ domain 902, the information bits are denoted as D and the frozen bits with a value of zero are denoted as F. Thus, the block D in FIG. 9 may generally correspond to the A and B blocks of FIG. 4. Systematic Polar encoding 904 of these bits creates a so-called mother code 906 that includes a block denoted as D (encoded data) and a block denoted as P 908 (encoded parity check bits). Thus, the mother code 906 is a systematic Polar code in this example. Coding and CRC 908 are then applied to provide a set of bits for a first transmission 910. Based on the selected coding rate, some of the bits of the mother code 906 are punctured. The resulting first transmission 910 thus corresponds to the first transmission (1TX) described in FIG. 8.

If the decoder (e.g., the decoder 800 of FIG. 8) does not successfully decode the first transmission 910 (e.g., a NAK 912 is received at the encoder 900), a second transmission (e.g., a retransmission) is invoked. Coding and CRC 916 are then applied to the bits of block B from the first transmission 914 to provide a set of encoded bits for the second transmission 918 (e.g., a retransmission).

First Example Apparatus

Figure 10:
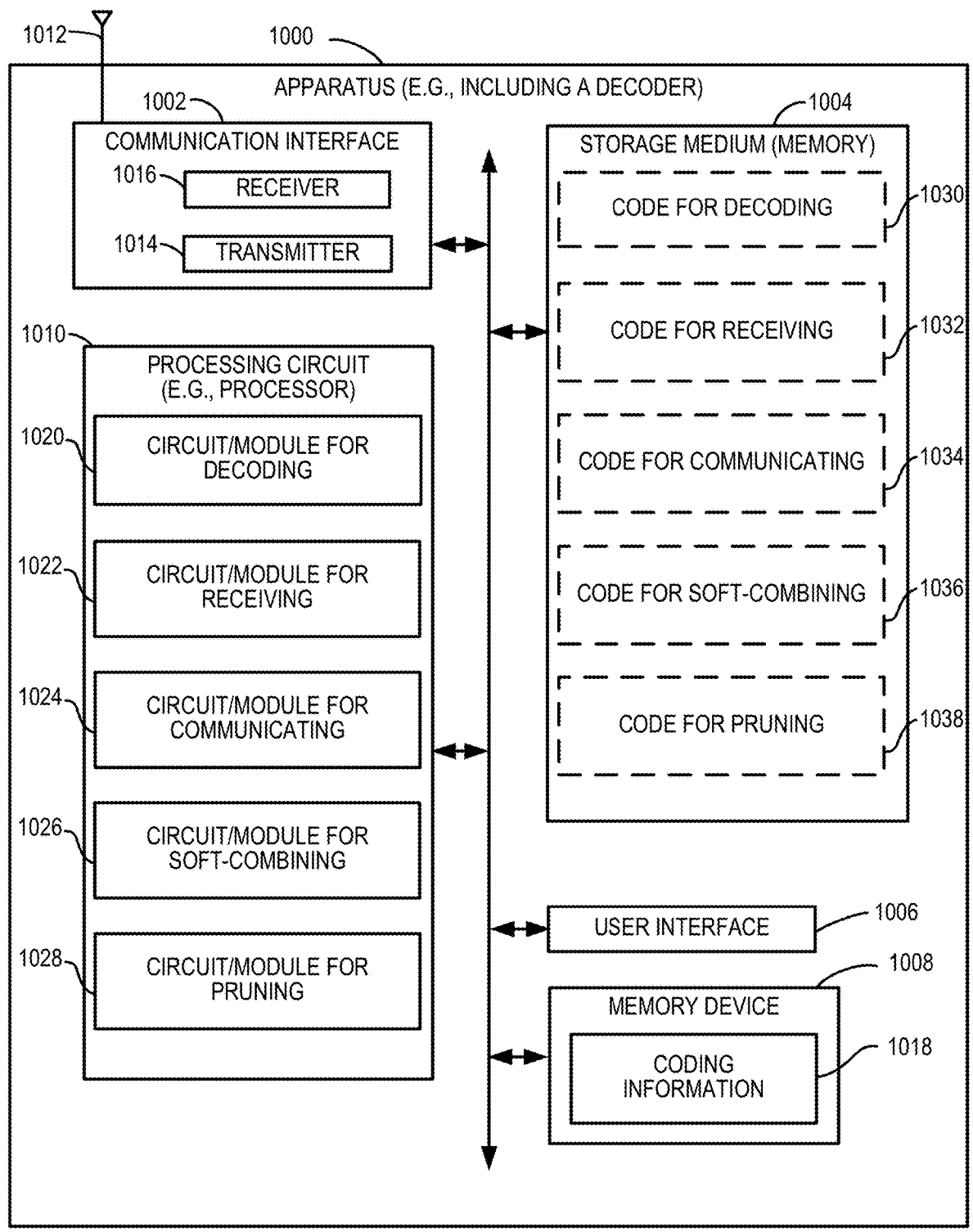
FIG. 10 is a block diagram illustrating an example hardware implementation for an apparatus (e.g., an electronic device) that can support decoding in accordance with some aspects of the disclosure.

FIG. 10 is an illustration of an apparatus 1000 that may provide decoding according to one or more aspects of the disclosure. The apparatus 1000 could embody or be implemented within a UE, a TRP, a gNB, a base station, or some other type of device that uses decoding. In various implementations, the apparatus 1000 could embody or be implemented within an access terminal, an access point, or some other type of device. In various implementations, the apparatus 1000 could embody or be implemented within a mobile phone, a smart phone, a tablet, a portable computer, a server, a network entity, a personal computer, a sensor, an alarm, a vehicle, a machine, an entertainment device, a medical device, or any other electronic device having circuitry.

The apparatus 1000 includes a communication interface 1002 (e.g., at least one transceiver), a storage medium 1004, a user interface 1006, a memory device 1008, and a processing circuit 1010 (e.g., at least one processor). These components can be coupled to and/or placed in electrical communication with one another via a signaling bus or other suitable component, represented generally by the connection lines in FIG. 10. The signaling bus may include any number of interconnecting buses and bridges depending on the specific application of the processing circuit 1010 and the overall design constraints. The signaling bus links together various circuits such that each of the communication interface 1002, the storage medium 1004, the user interface 1006, and the memory device 1008 are coupled to and/or in electrical communication with the processing circuit 1010. The signaling bus may also link various other circuits (not shown) such as timing sources, peripherals, voltage regulators, and power management circuits, which are well known in the art, and therefore, will not be described any further.

The communication interface 1002 may be adapted to facilitate wireless communication of the apparatus 1000. For example, the communication interface 1002 may include circuitry and/or programming adapted to facilitate the communication of information bi-directionally with respect to one or more communication devices in a network. Thus, in some implementations, the communication interface 1002 may be coupled to one or more antennas 1012 for wireless communication within a wireless communication system. In some implementations, the communication interface 1002 may be configured for wire-based communication. For example, the communication interface 1002 could be a bus interface, a send/receive interface, or some other type of signal interface including drivers, buffers, or other circuitry for outputting and/or obtaining signals (e.g., outputting signal from and/or receiving signals into an integrated circuit). The communication interface 1002 can be configured with one or more standalone receivers and/or transmitters, as well as one or more transceivers. In the illustrated example, the communication interface 1002 includes a transmitter 1014 and a receiver 1016.

The memory device 1008 may represent one or more memory devices. As indicated, the memory device 1008 may maintain coding-related information 1018 along with other information used by the apparatus 1000. In some implementations, the memory device 1008 and the storage medium 1004 are implemented as a common memory component. The memory device 1008 may also be used for storing data that is manipulated by the processing circuit 1010 or some other component of the apparatus 1000.

The storage medium 1004 may represent one or more computer-readable, machine-readable, and/or processor-readable devices for storing programming, such as processor executable code or instructions (e.g., software, firmware), electronic data, databases, or other digital information. The storage medium 1004 may also be used for storing data that is manipulated by the processing circuit 1010 when executing programming. The storage medium 1004 may be any available media that can be accessed by a general purpose or special purpose processor, including portable or fixed storage devices, optical storage devices, and various other mediums capable of storing, containing or carrying programming.

By way of example and not limitation, the storage medium 1004 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The storage medium 1004 may be embodied in an article of manufacture (e.g., a computer program product). By way of example, a computer program product may include a computer-readable medium in packaging materials. In view of the above, in some implementations, the storage medium 1004 may be a non-transitory (e.g., tangible) storage medium.

The storage medium 1004 may be coupled to the processing circuit 1010 such that the processing circuit 1010 can read information from, and write information to, the storage medium 1004. That is, the storage medium 1004 can be coupled to the processing circuit 1010 so that the storage medium 1004 is at least accessible by the processing circuit 1010, including examples where at least one storage medium is integral to the processing circuit 1010 and/or examples where at least one storage medium is separate from the processing circuit 1010 (e.g., resident in the apparatus 1000, external to the apparatus 1000, distributed across multiple entities, etc.).

Programming stored by the storage medium 1004, when executed by the processing circuit 1010, causes the processing circuit 1010 to perform one or more of the various functions and/or process operations described herein. For example, the storage medium 1004 may include operations configured for regulating operations at one or more hardware blocks of the processing circuit 1010, as well as to utilize the communication interface 1002 for wireless communication utilizing their respective communication protocols. In some aspects, the storage medium 1004 may be a non-transitory computer-readable medium storing computer-executable code, including code to perform operations as described herein.

The processing circuit 1010 is generally adapted for processing, including the execution of such programming stored on the storage medium 1004. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 1010 is arranged to obtain, process and/or send data, control data access and storage, issue commands, and control other desired operations. The processing circuit 1010 may include circuitry configured to implement desired programming provided by appropriate media in at least one example. For example, the processing circuit 1010 may be implemented as one or more processors, one or more controllers, and/or other structure configured to execute executable programming Examples of the processing circuit 1010 may include a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 1010 may also be implemented as a combination of computing components, such as a combination of a DSP and a microprocessor, a number of microprocessors, one or more microprocessors in conjunction with a DSP core, an ASIC and a microprocessor, or any other number of varying configurations. These examples of the processing circuit 1010 are for illustration and other suitable configurations within the scope of the disclosure are also contemplated.

According to one or more aspects of the disclosure, the processing circuit 1010 may be adapted to perform any or all of the features, processes, functions, operations and/or routines for any or all of the apparatuses described herein. For example, the processing circuit 1010 may be configured to perform any of the steps, functions, and/or processes described with respect to FIGS. 1-9 and 11-14. As used herein, the term "adapted" in relation to the processing circuit 1010 may refer to the processing circuit 1010 being one or more of configured, used, implemented, and/or programmed to perform a particular process, function, operation and/or routine according to various features described herein.

The processing circuit 1010 may be a specialized processor, such as an application specific integrated circuit (ASIC) that serves as a means for (e.g., structure for) carrying out any one of the operations described in conjunction with 1-9 and 11-14. The processing circuit 1010 may serve as one example of a means for transmitting and/or a means for receiving. In various implementations, the processing circuit 1010 may provide and/or incorporate the functionality of the second wireless communication device 204 (e.g., the decoder 214) of FIG. 2 or the decoder 1704 of FIG. 17.

According to at least one example of the apparatus 1000, the processing circuit 1010 may include one or more of a circuit/module for decoding 1020, a circuit/module for receiving 1022, a circuit/module for communicating 1024, a circuit/module for soft-combining 1026, or a circuit/module for pruning 1028. In various implementations, the circuit/module for decoding 1020, the circuit/module for receiving 1022, the circuit/module for communicating 1024, the circuit/module for soft-combining 1026, or the circuit/module for pruning 1028 may provide and/or incorporate, at least in part, the functionality described above for the second wireless communication device 204 (e.g., the decoder 214) of FIG. 2 or the decoder 1704 of FIG. 17.

As mentioned above, programming stored by the storage medium 1004, when executed by the processing circuit 1010, causes the processing circuit 1010 to perform one or more of the various functions and/or process operations described herein. For example, the programming may cause the processing circuit 1010 to perform the various functions, steps, and/or processes described herein with respect to FIGS. 1-9 and 11-14. As shown in FIG. 10, the storage medium 1004 may include one or more of code for decoding 1030, code for receiving 1032, code for communicating 1034, code for soft-combining 1036, or code for pruning 1038. In various implementations, the code for decoding 1030, the code for receiving 1032, the code for communicating 1034, the code for soft-combining 1036, or the code for pruning 1038 may be executed or otherwise used to provide the functionality described herein for the circuit/module for decoding 1020, the circuit/module for receiving 1022, the circuit/module for communicating 1024, the circuit/module for soft-combining 1026, or the circuit/module for pruning 1028.

The circuit/module for decoding 1020 may include circuitry and/or programming (e.g., code for decoding 1030 stored on the storage medium 1004) adapted to perform several functions relating to, for example, decoding information. In some aspects, the circuit/module for decoding 1020 (e.g., a means for decoding) may correspond to, for example, a processing circuit.

In some aspects, the circuit/module for decoding 1020 may execute a decoding algorithm. For example, the circuit/module for decoding 1020 may perform a list decoding algorithm. In some aspects, the circuit/module for decoding 1020 may perform the encoding operations described herein conjunction with FIGS. 1-9. The circuit/module for decoding 1020 may then output the resulting decoded information (e.g., to the circuit/module for pruning 1028, the memory device 1008, the communication interface 1002, or some other component) or use the results internally.

The circuit/module for receiving 1022 may include circuitry and/or programming (e.g., code for receiving 1032 stored on the storage medium 1004) adapted to perform several functions relating to, for example, receiving information. In some scenarios, the circuit/module for receiving 1022 may obtain information (e.g., from the communication interface 1002, the memory device, or some other component of the apparatus 1000) and process (e.g., decode) the information. In some scenarios (e.g., if the circuit/module for receiving 1022 is or includes an RF receiver), the circuit/module for receiving 1022 may receive information directly from a device that transmitted the information. In either case, the circuit/module for receiving 1022 may output the obtained information to another component of the apparatus 1000 (e.g., the circuit/module for decoding 1020, the memory device 1008, or some other component).

The circuit/module for receiving 1022 (e.g., a means for receiving) may take various forms. In some aspects, the circuit/module for receiving 1022 may correspond to, for example, an interface (e.g., a bus interface, a /receive interface, or some other type of signal interface), a communication device, a transceiver, a receiver, or some other similar component as discussed herein. In some implementations, the communication interface 1002 includes the circuit/module for receiving 1022 and/or the code for receiving 1032. In some implementations, the circuit/module for receiving 1022 and/or the code for receiving 1032 is configured to control the communication interface 1002 (e.g., a transceiver or a receiver) to receive information.

The circuit/module for communicating 1024 may include circuitry and/or programming (e.g., code for communicating 1034 stored on the storage medium 1004) adapted to perform several functions relating to, for example, communicating information. In some implementations, the communication involves receiving the information. In some implementations, the communication involves sending (e.g., transmitting) the information.

In some implementations where the communicating involves receiving information, the circuit/module for communicating 1024 receives information (e.g., from the communication interface 1002, the receiver 1016, the memory device 1008, some other component of the apparatus 1000, or some other device), processes (e.g., decodes) the information, and outputs the information to another component of the apparatus 1000 (e.g., the circuit/module for decoding 1020, the memory device 1008, or some other component). In some scenarios (e.g., if the circuit/module for communicating 1024 includes a receiver), the communicating involves the circuit/module for communicating 1024 receiving information directly from a device that transmitted the information (e.g., via radio frequency signaling or some other type of signaling suitable for the applicable communication medium).

In some implementations where the communicating involves sending information, the circuit/module for communicating 1024 obtains information (e.g., from the memory device 1008 or some other component of the apparatus 1000), processes (e.g., encodes for transmission) the information, and outputs the processed information. In some scenarios, the communicating involves sending the information to another component of the apparatus 1000 (e.g., the transmitter 1014, the communication interface 1002, or some other component) that will transmit the information to another device. In some scenarios (e.g., if the circuit/module for communicating 1024 includes a transmitter), the communicating involves the circuit/module for communicating 1024 transmitting the information directly to another device (e.g., the ultimate destination) via radio frequency signaling or some other type of signaling suitable for the applicable communication medium.

The circuit/module for communicating 1024 (e.g., a means for communicating) may take various forms. In some aspects, the circuit/module for communicating 1024 may correspond to, for example, an interface (e.g., a bus interface, a send/receive interface, or some other type of signal interface), a communication device, a transceiver, a transmitter, a receiver, or some other similar component as discussed herein. In some implementations, the communication interface 1002 includes the circuit/module for communicating 1024 and/or the code for communicating 1034. In some implementations, the circuit/module for communicating 1024 and/or the code for communicating 1034 is configured to control the communication interface 1002 (e.g., a transceiver, a receiver, or a transmitter) to communicate the information.

The circuit/module for soft-combining 1026 may include circuitry and/or programming (e.g., code for soft-combining 1036 stored on the storage medium 1004) adapted to perform several functions relating to, for example, soft-combining information. In some aspects, the circuit/module for soft-combining 1026 (e.g., a means for soft-combining) may correspond to, for example, a processing circuit.

In some aspects, the circuit/module for soft-combining 1026 may execute a soft-combining algorithm. For example, the circuit/module for soft-combining 1026 may perform the soft-combining operations described herein conjunction with FIGS. 1-9. The circuit/module for soft-combining 1026 may then output the resulting information (e.g., to the circuit/module for decoding 1020, the memory device 1008, the communication interface 1002, or some other component).

The circuit/module for pruning 1028 may include circuitry and/or programming (e.g., code for pruning 1038 stored on the storage medium 1004) adapted to perform several functions relating to, for example, soft-combining information. In some aspects, the circuit/module for pruning 1028 (e.g., a means for pruning) may correspond to, for example, a processing circuit.

In some aspects, the circuit/module for pruning 1028 may execute a pruning algorithm. For example, the circuit/module for pruning 1028 may perform the pruning operations described herein conjunction with FIGS. 1-9. The circuit/module for pruning 1028 may then output the resulting information (e.g., to the circuit/module for decoding 1020, the memory device 1008, the communication interface 1002, or some other component).

First Example Process

Figure 11:
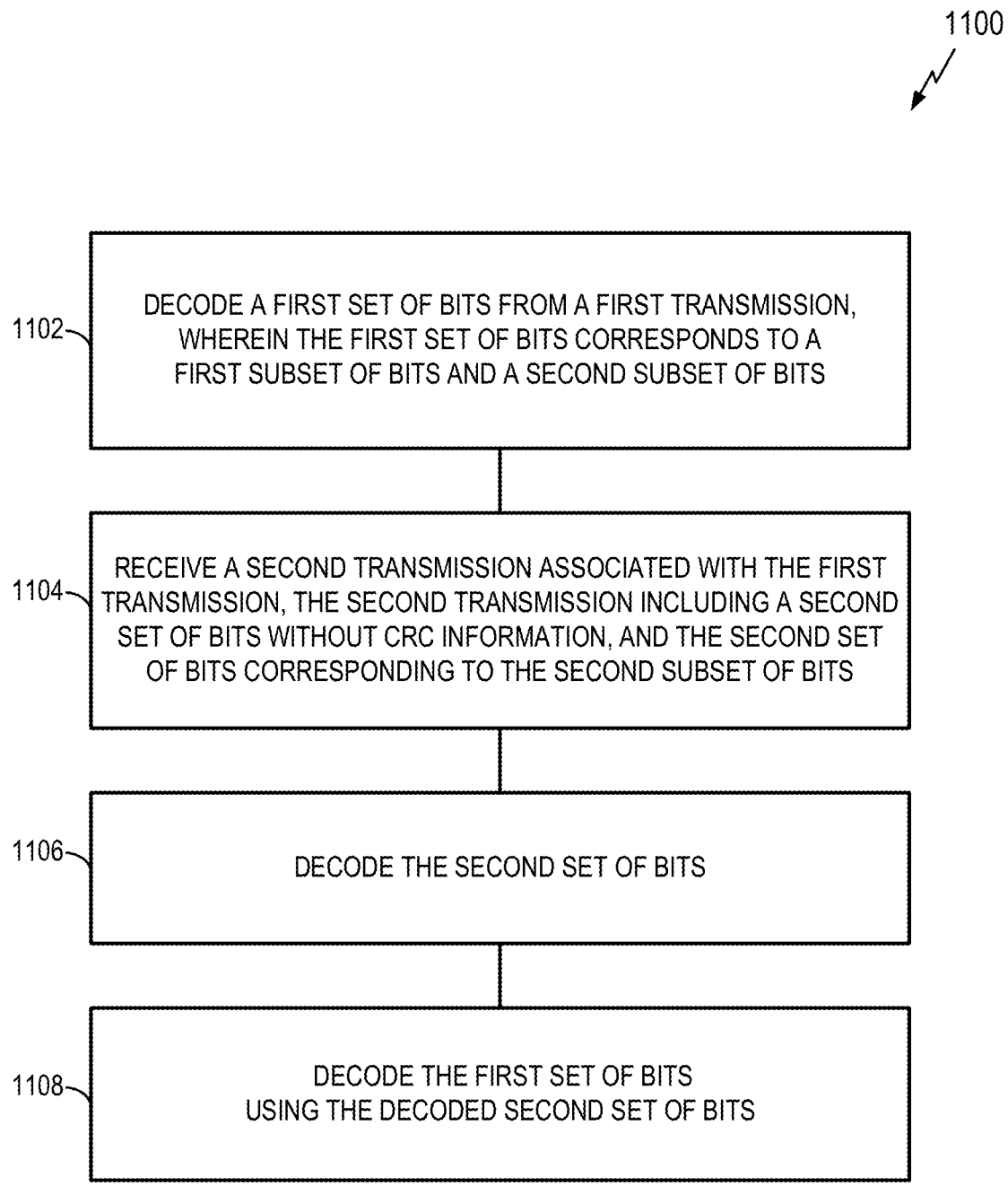
FIG. 11 is a flowchart illustrating an example of a decoding process in accordance with some aspects of the disclosure.

FIG. 11 illustrates a process 1100 for communication in accordance with some aspects of the disclosure. The process 1100 may take place within a processing circuit (e.g., the processing circuit 1010 of FIG. 10), which may be located in an access terminal, a base station, or some other suitable apparatus (e.g., that includes a decoder). Of course, in various aspects within the scope of the disclosure, the process 1100 may be implemented by any suitable apparatus capable of supporting signaling-related operations.

At block 1102, an apparatus (e.g., a device that includes a decoder) decodes a first set of bits from a first transmission. In some aspects, the first set of bits may correspond to a first subset of bits and a second subset of bits. In some aspects, the bits may be Polar coded bits. In some aspects, the bits may be systematic Polar coded bits.

In some implementations, the circuit/module for decoding 1020 of FIG. 10 performs the operations of block 1102. In some implementations, the code for decoding 1030 of FIG. 10 is executed to perform the operations of block 1102.

At block 1104, the apparatus receives a second transmission associated with the first transmission, the second transmission including a second set of bits without cyclic redundancy check (CRC) information, and the second set of bits corresponding to the second subset of bits.

In some implementations, the circuit/module for receiving 1022 of FIG. 10 performs the operations of block 1104. In some implementations, the code for receiving 1032 of FIG. 10 is executed to perform the operations of block 1104.

At block 1106, the apparatus decodes the second set of bits. The bits may take different forms in different implementations. In some aspects, the first set of bits and the second set of bits may be systematic coded bits. In some aspects, the first set of bits and the second set of bits may be Polar coded bits.

In some implementations, the circuit/module for decoding 1020 of FIG. 10 performs the operations of block 1106. In some implementations, the code for decoding 1030 of FIG. 10 is executed to perform the operations of block 1106.

At block 1108, the apparatus decodes the first set of bits using the decoded second set of bits.

In some implementations, the circuit/module for decoding 1020 of FIG. 10 performs the operations of block 1108. In some implementations, the code for decoding 1030 of FIG. 10 is executed to perform the operations of block 1108.

The decoding may take different forms in different implementations. In some aspects, the decoding may include list decoding.

In some aspects, the decoding of the first set of bits may involve decoding the second subset of bits; and the decoding of the first set of bits using the decoded second set of bits may include using candidate vectors from the decoding of the second set of bits instead of candidate vectors from the decoding of the second subset of bits.

In some aspects, the decoding of the first set of bits may involve generating a decoded second subset of bits; the decoding of the second set of bits may involve generating a decoded second set of bits; and the decoding of the first set of bits using the decoded second set of bits may include: soft-combining the decoded second subset of bits and the decoded second set of bits to generate soft-combined bits, and recovering the first set of bits based on the soft-combined bits. In some aspects, the soft-combining may include generating candidate vectors; and the decoding of the first set of bits using the decoded second set of bits may be based on the candidate vectors.

In some aspects, a process may include any combination of the aspects described above.

Second Example Process

Figure 12:
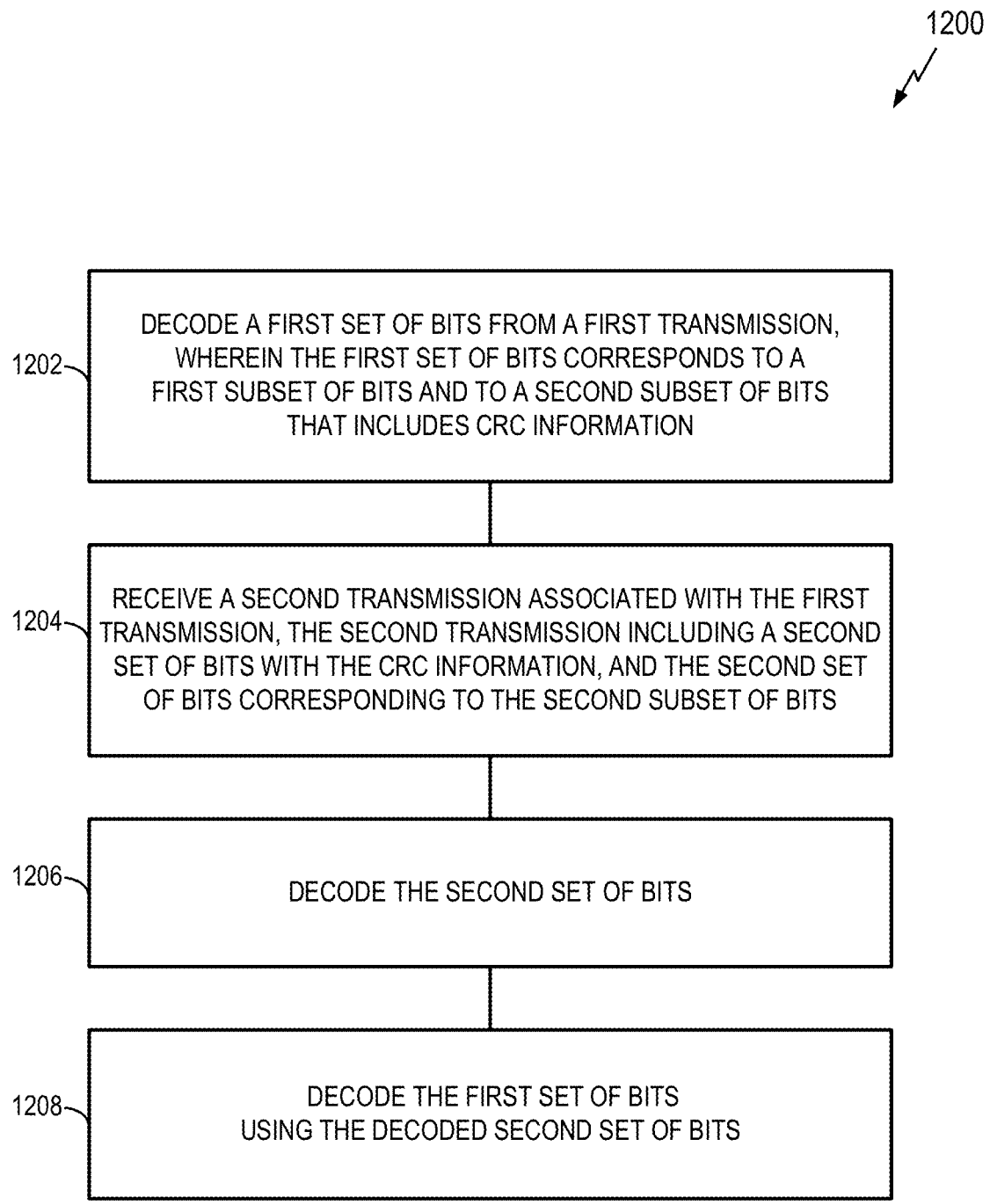
FIG. 12 is a flowchart illustrating another example of a decoding process in accordance with some aspects of the disclosure.

FIG. 12 illustrates a process 1200 for communication in accordance with some aspects of the disclosure. The process 1200 may take place within a processing circuit (e.g., the processing circuit 1010 of FIG. 10), which may be located in an access terminal, a base station, or some other suitable apparatus (e.g., that includes a decoder). Of course, in various aspects within the scope of the disclosure, the process 1200 may be implemented by any suitable apparatus capable of supporting signaling-related operations.

At block 1202, an apparatus (e.g., a device that includes a decoder) decodes a first set of bits from a first transmission. In some aspects, the first set of bits may correspond to a first subset of bits and to a second subset of bits that includes cyclic redundancy check (CRC) information. In some aspects, the bits may be Polar coded bits. In some aspects, the bits may be systematic Polar coded bits.

In some implementations, the circuit/module for decoding 1020 of FIG. 10 performs the operations of block 1202. In some implementations, the code for decoding 1030 of FIG. 10 is executed to perform the operations of block 1202.

At block 1204, the apparatus receives a second transmission associated with the first transmission, the second transmission including a second set of bits with the cyclic redundancy check (CRC) information, and the second set of bits corresponding to the second subset of bits.

In some aspects, the first subset of bits may include other CRC information; and the CRC information of the second subset of bits may be independent of the other CRC information of the first subset of bits.

In some implementations, the circuit/module for receiving 1022 of FIG. 10 performs the operations of block 1204. In some implementations, the code for receiving 1032 of FIG. 10 is executed to perform the operations of block 1204.

At block 1206, the apparatus decodes the second set of bits. The bits may take different forms in different implementations. In some aspects, the first set of bits and the second set of bits may be systematic coded bits. In some aspects, the first set of bits and the second set of bits may be Polar coded bits.

In some implementations, the circuit/module for decoding 1020 of FIG. 10 performs the operations of block 1206. In some implementations, the code for decoding 1030 of FIG. 10 is executed to perform the operations of block 1206.

At block 1208, the apparatus decodes the first set of bits using the decoded second set of bits.

In some implementations, the circuit/module for decoding 1020 of FIG. 10 performs the operations of block 1208. In some implementations, the code for decoding 1030 of FIG. 10 is executed to perform the operations of block 1208.

The decoding may take different forms in different implementations. In some aspects, the decoding may include list decoding.

In some aspects, the decoding of the first set of bits using the decoded second set of bits may include: pruning candidate vectors from the decoding of the second set of bits through use of the CRC information; and recovering the first set of bits based on the pruned candidate vectors.

In some aspects, a process may include any combination of the aspects described above.

Third Example Process

Figure 13:
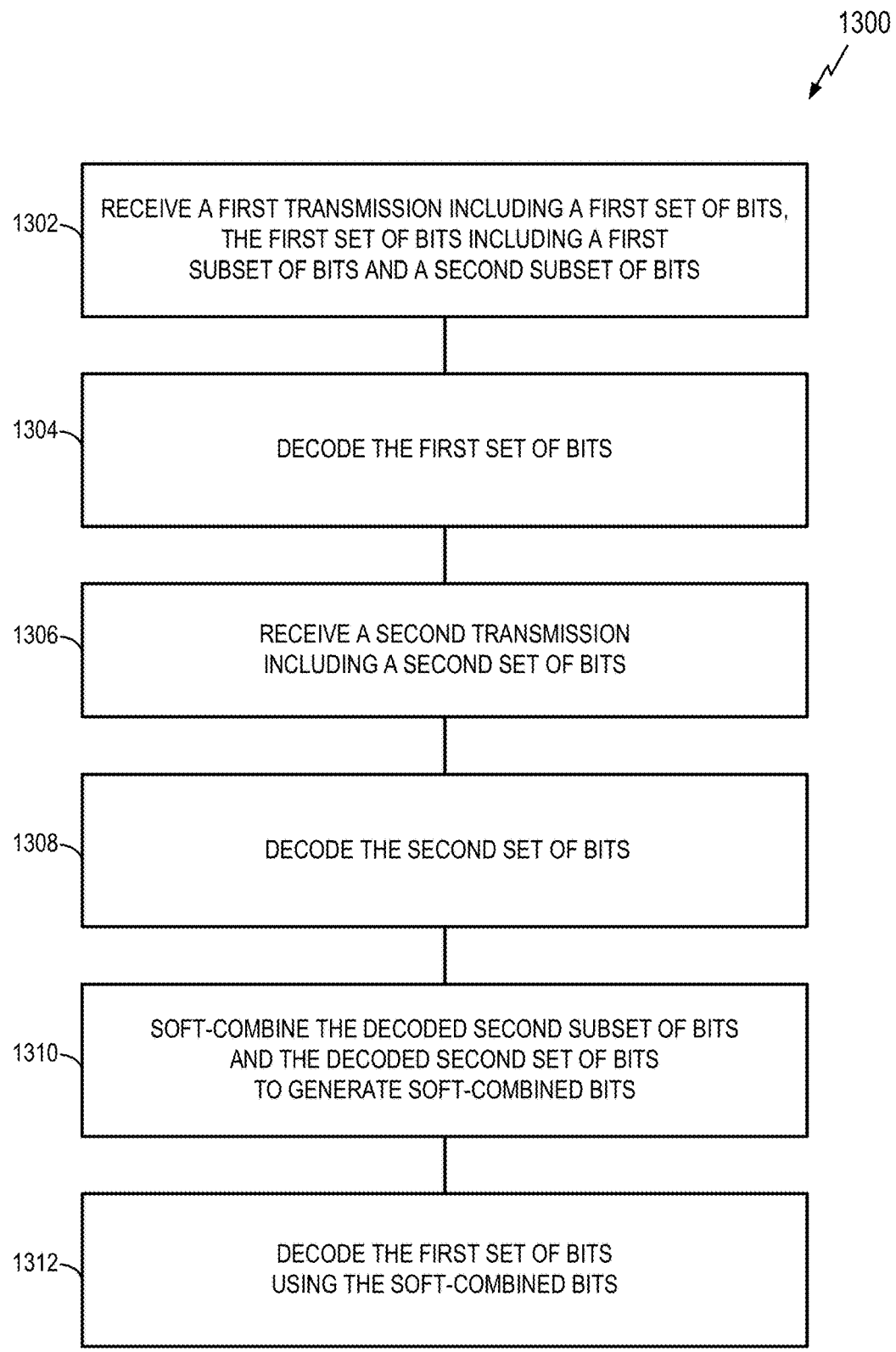
FIG. 13 is a flowchart illustrating an example of decoding operations in accordance with some aspects of the disclosure.

FIG. 13 illustrates a process 1300 for communication in accordance with some aspects of the disclosure. One or more aspects of the process 1300 may be used in conjunction with (e.g., in addition to or as part of) the process 1100 of FIG. 11 and/or the process 1200 of FIG. 12. The process 1300 may take place within a processing circuit (e.g., the processing circuit 1010 of FIG. 10), which may be located in an access terminal, a base station, or some other suitable apparatus (e.g., that includes a decoder). Of course, in various aspects within the scope of the disclosure, the process 1300 may be implemented by any suitable apparatus capable of supporting signaling-related operations.

At block 1302, an apparatus (e.g., a device that includes a decoder) receives a first transmission including a first set of bits, the first set of bits including a first subset of bits and a second subset of bits.

In some implementations, the circuit/module for receiving 1022 of FIG. 10 performs the operations of block 1302. In some implementations, the code for receiving 1032 of FIG. 10 is executed to perform the operations of block 1302.

At block 1304, the apparatus decodes the first set of bits.

In some implementations, the circuit/module for decoding 1020 of FIG. 10 performs the operations of block 1304. In some implementations, the code for decoding 1030 of FIG. 10 is executed to perform the operations of block 1304.

At block 1306, the apparatus receives a second transmission including a second set of bits.

In some implementations, the circuit/module for receiving 1022 of FIG. 10 performs the operations of block 1306. In some implementations, the code for receiving 1032 of FIG. 10 is executed to perform the operations of block 1306.

At block 1308, the apparatus decodes the second set of bits.

In some implementations, the circuit/module for decoding 1020 of FIG. 10 performs the operations of block 1308. In some implementations, the code for decoding 1030 of FIG. 10 is executed to perform the operations of block 1308.

At block 1310, the apparatus soft-combines the decoded second subset of bits and the decoded second set of bits to generate soft-combined bits.

In some implementations, the circuit/module for soft-combining 1026 of FIG. 10 performs the operations of block 1310. In some implementations, the code for soft-combining 1036 of FIG. 10 is executed to perform the operations of block 1310.

At block 1312, the apparatus decodes the first set of bits using the soft-combined bits.

In some implementations, the circuit/module for decoding 1020 of FIG. 10 performs the operations of block 1312. In some implementations, the code for decoding 1030 of FIG. 10 is executed to perform the operations of block 1312.

In some aspects, a process may include any combination of the aspects described above.

Fourth Example Process

Figure 14:
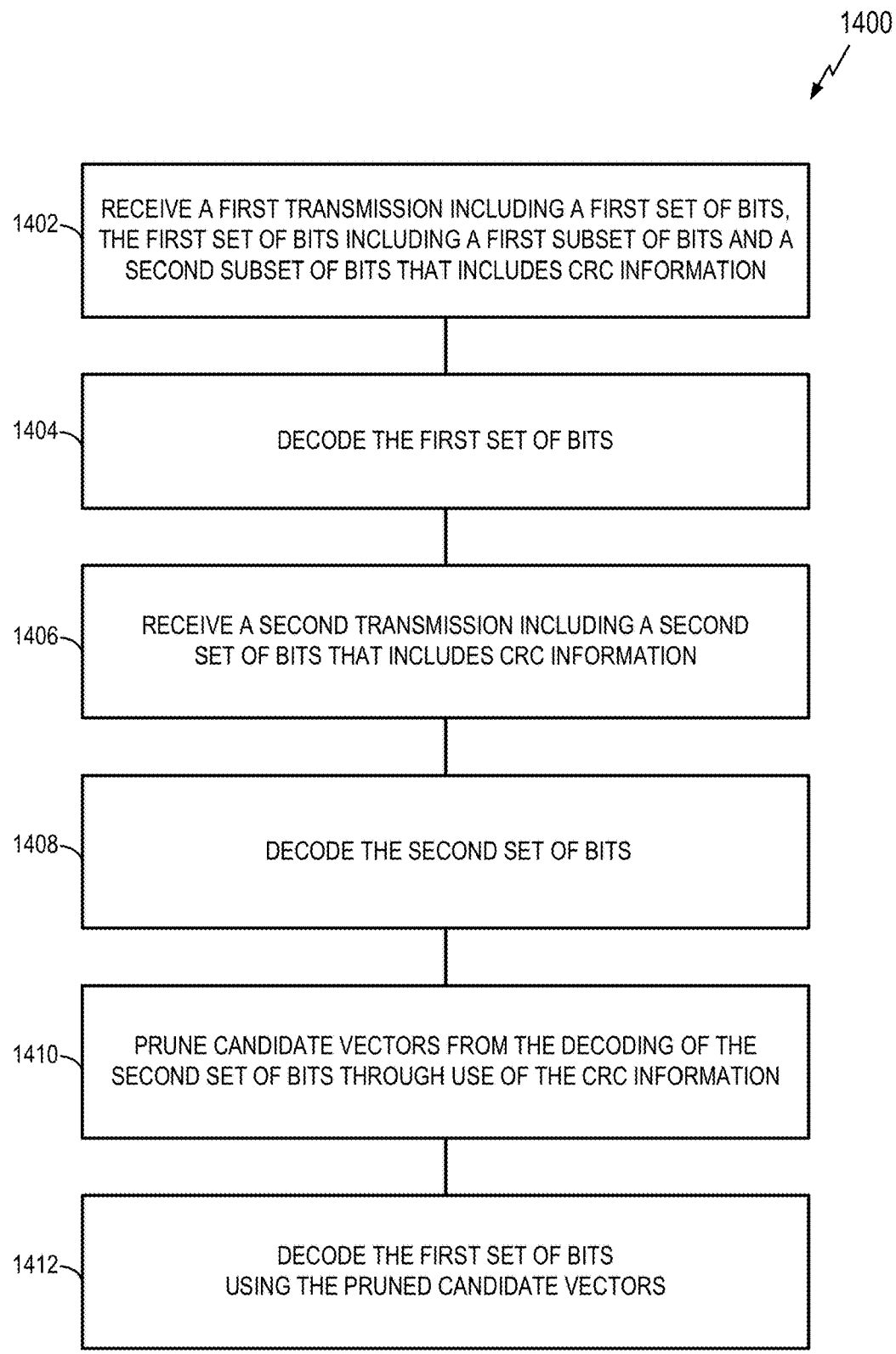
FIG. 14 is a flowchart illustrating another example of decoding operations in accordance with some aspects of the disclosure.

FIG. 14 illustrates a process 1400 for communication in accordance with some aspects of the disclosure. One or more aspects of the process 1400 may be used in conjunction with (e.g., in addition to or as part of) the process 1100 of FIG. 11 and/or the process 1200 of FIG. 12. The process 1400 may take place within a processing circuit (e.g., the processing circuit 1010 of FIG. 10), which may be located in an access terminal, a base station, or some other suitable apparatus (e.g., that includes a decoder). Of course, in various aspects within the scope of the disclosure, the process 1400 may be implemented by any suitable apparatus capable of supporting signaling-related operations.

At block 1402, an apparatus (e.g., a device that includes a decoder) receives a first transmission including a first set of bits, the first set of bits including a first subset of bits and a second subset of bits that includes CRC information.

In some implementations, the circuit/module for receiving 1022 of FIG. 10 performs the operations of block 1402. In some implementations, the code for receiving 1032 of FIG. 10 is executed to perform the operations of block 1402.

At block 1404, the apparatus decodes the first set of bits.

In some implementations, the circuit/module for decoding 1020 of FIG. 10 performs the operations of block 1404. In some implementations, the code for decoding 1030 of FIG. 10 is executed to perform the operations of block 1404.

At block 1406, the apparatus receives a second transmission including a second set of bits that includes the CRC information.

In some implementations, the circuit/module for receiving 1022 of FIG. 10 performs the operations of block 1406. In some implementations, the code for receiving 1032 of FIG. 10 is executed to perform the operations of block 1406.

At block 1408, the apparatus decodes the second set of bits.

In some implementations, the circuit/module for decoding 1020 of FIG. 10 performs the operations of block 1408. In some implementations, the code for decoding 1030 of FIG. 10 is executed to perform the operations of block 1408.

At block 1410, the apparatus prunes candidate vectors from the decoding of the second set of bits through use of the CRC information.

In some implementations, the circuit/module for pruning 1028 of FIG. 10 performs the operations of block 1410. In some implementations, the code for pruning 1038 of FIG. 10 is executed to perform the operations of block 1410.

At block 1412, the apparatus decodes the first set of bits using the pruned candidate vectors.

In some implementations, the circuit/module for decoding 1020 of FIG. 10 performs the operations of block 1412. In some implementations, the code for decoding 1030 of FIG. 10 is executed to perform the operations of block 1412.

In some aspects, a process may include any combination of the aspects described above.

Second Example Apparatus

Figure 15:
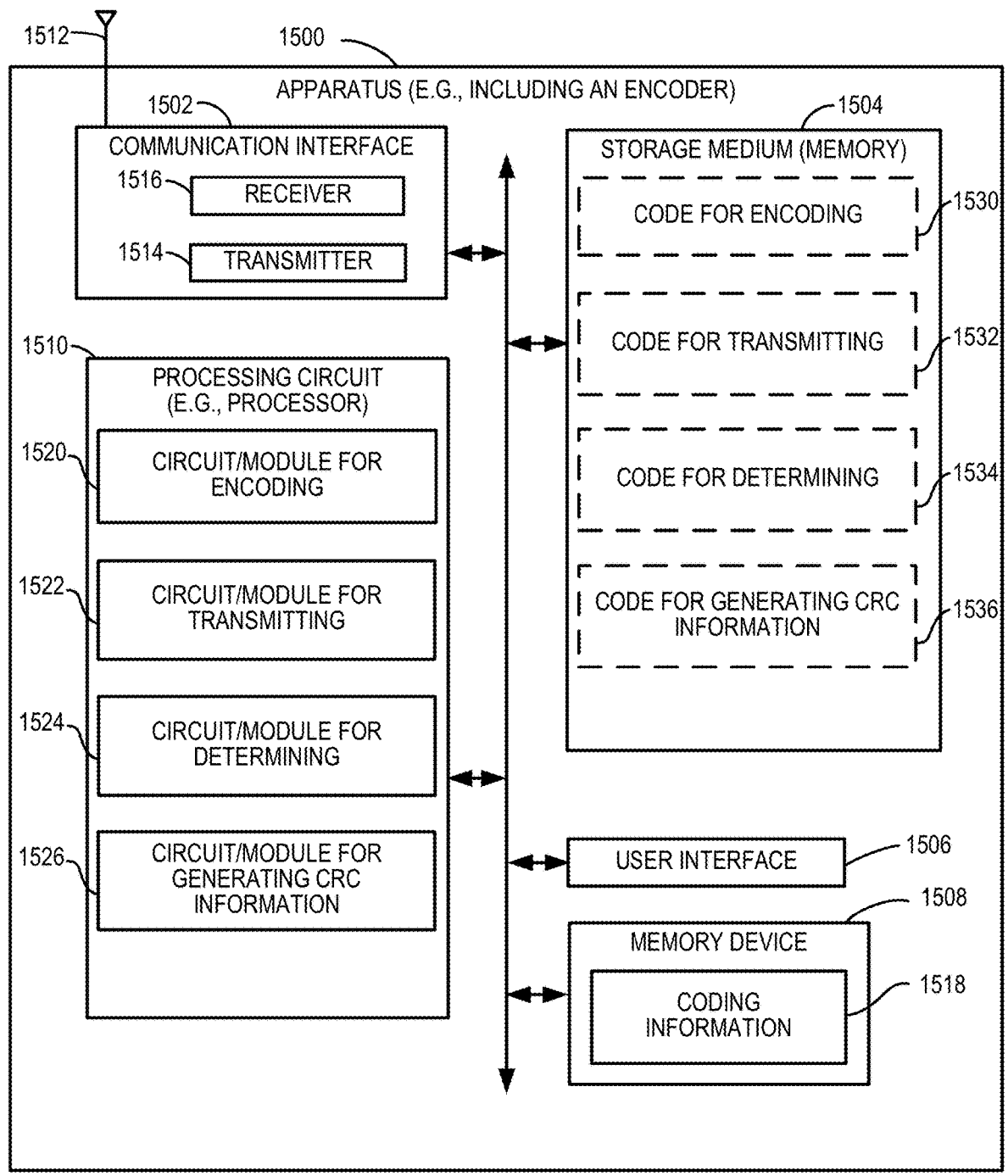
FIG. 15 is a block diagram illustrating an example hardware implementation for an apparatus (e.g., an electronic device) that can support encoding in accordance with some aspects of the disclosure.

FIG. 15 illustrates a block diagram of an example hardware implementation of an apparatus 1500 configured to provide encoding according to one or more aspects of the disclosure. The apparatus 1500 could embody or be implemented within a UE, a TRP, a gNB, a base station, or some other type of device that supports encoding as taught herein. In various implementations, the apparatus 1500 could embody or be implemented within an access terminal, an access point, or some other type of device. In various implementations, the apparatus 1500 could embody or be implemented within a mobile phone, a smart phone, a tablet, a portable computer, a server, a network entity, a personal computer, a sensor, an alarm, a vehicle, a machine, an entertainment device, a medical device, or any other electronic device having circuitry.

The apparatus 1500 includes a communication interface (e.g., at least one transceiver) 1502, a storage medium 1504, a user interface 1506, a memory device 1508 (e.g., storing coding information 1518), and a processing circuit (e.g., at least one processor) 1510. In various implementations, the user interface 1506 may include one or more of: a keypad, a display, a speaker, a microphone, a touchscreen display, of some other circuitry for receiving an input from or sending an output to a user. The communication interface 1502 may be coupled to one or more antennas 1512, and may include a transmitter 1514 and a receiver 1516. In general, the components of FIG. 15 may be similar to corresponding components of the apparatus 1000 of FIG. 10.

According to one or more aspects of the disclosure, the processing circuit 1510 may be adapted to perform any or all of the features, processes, functions, operations and/or routines for any or all of the apparatuses described herein. For example, the processing circuit 1510 may be configured to perform any of the steps, functions, and/or processes described with respect to FIGS. 1-9 and 16. As used herein, the term "adapted" in relation to the processing circuit 1510 may refer to the processing circuit 1510 being one or more of configured, used, implemented, and/or programmed to perform a particular process, function, operation and/or routine according to various features described herein.

The processing circuit 1510 may be a specialized processor, such as an application-specific integrated circuit (ASIC) that serves as a means for (e.g., structure for) carrying out any one of the operations described in conjunction with FIGS. 1-9 and 16. The processing circuit 1510 serves as one example of a means for transmitting and/or a means for receiving. In various implementations, the processing circuit 1510 may provide and/or incorporate the functionality of the first wireless communication device 202 (e.g., the encoder 212) of FIG. 2 or the encoder 1702 of FIG. 17.

According to at least one example of the apparatus 1500, the processing circuit 1510 may include one or more of a circuit/module for encoding 1520, a circuit/module for transmitting 1522, a circuit/module for determining 1524, or a circuit/module for generating CRC information 1526. In various implementations, the circuit/module for encoding 1520, the circuit/module for transmitting 1522, the circuit/module for determining 1524, or the circuit/module for generating CRC information 1526 may provide and/or incorporate, at least in part, the functionality described above for the first wireless communication device 152 (e.g., the encoder 212) of FIG. 2 or the encoder 1702 of FIG. 17.

As mentioned above, programming stored by the storage medium 1504, when executed by the processing circuit 1510, causes the processing circuit 1510 to perform one or more of the various functions and/or process operations described herein. For example, the programming may cause the processing circuit 1510 to perform the various functions, steps, and/or processes described herein with respect to FIGS. 1-9 and 16 in various implementations. As shown in FIG. 15, the storage medium 1504 may include one or more of code for encoding 1530, code for transmitting 1532, code for determining 1534, or code for generating CRC information 1536. In various implementations, the code for encoding 1530, the code for transmitting 1532, the code for determining 1534, or the code for generating CRC information 1536 may be executed or otherwise used to provide the functionality described herein for the circuit/module for encoding 1520, the circuit/module for transmitting 1522, the circuit/module for determining 1524, or the circuit/module for generating CRC information 1526.

The circuit/module for encoding 1520 may include circuitry and/or programming (e.g., code for encoding 1530 stored on the storage medium 1504) adapted to perform several functions relating to, for example, encoding information. In some aspects, the circuit/module for encoding 1520 (e.g., a means for encoding) may correspond to, for example, a processing circuit.

In some aspects, the circuit/module for encoding 1520 may execute an encoding algorithm. For example, the circuit/module for encoding 1520 may perform a block coding algorithm or a Polar coding algorithm. In some aspects, the circuit/module for encoding 1520 may perform the encoding operations described herein conjunction with FIGS. 1-9. The circuit/module for encoding 1520 then outputs the resulting encoded information (e.g., to the circuit/module for transmitting 1522, the memory device 1508, the communication interface 1502, or some other component).

The circuit/module for transmitting 1522 may include circuitry and/or programming (e.g., code for transmitting 1532 stored on the storage medium 1504) adapted to perform several functions relating to, for example, transmitting (e.g., sending) information. In some implementations, the circuit/module for transmitting 1522 may obtain information (e.g., from the circuit/module for encoding 1520, the memory device 1508, or some other component of the apparatus 1500) and process the information (e.g., encode the information for transmission). In some scenarios, the circuit/module for transmitting 1522 sends the information to another component (e.g., the transmitter 1514, the communication interface 1502, or some other component) that will send the information to another device. In some scenarios (e.g., if the circuit/module for transmitting 1522 includes a transmitter), the circuit/module for transmitting 1522 transmits the information directly to another device (e.g., the ultimate destination) via radio frequency signaling or some other type of signaling suitable for the applicable communication medium.

The circuit/module for transmitting 1522 (e.g., a means for outputting, a means for sending, a means for transmitting, etc.) may take various forms. In some aspects, the circuit/module for transmitting 1522 may correspond to, for example, a processing circuit as discussed herein. In some aspects, the circuit/module for transmitting 1522 may correspond to, for example, an interface (e.g., a bus interface, a send interface, or some other type of signal interface), a communication device, a transceiver, a transmitter, or some other similar component as discussed herein. In some implementations, the communication interface 1502 includes the circuit/module for transmitting 1522 and/or the code for transmitting 1532. In some implementations, the circuit/module for transmitting 1522 and/or the code for transmitting 1532 is configured to control the communication interface 1502 (e.g., a transceiver or a transmitter) to transmit information.

The circuit/module for determining 1524 may include circuitry and/or programming (e.g., code for determining 1534 stored on the storage medium 1504) adapted to perform several functions relating to, for example, determining whether to perform a second transmission. In some aspects, the circuit/module for determining 1524 (e.g., a means for determining) may correspond to, for example, a processing circuit.

In some scenarios, the circuit/module for determining 1524 may obtain feedback information. For example, the circuit/module for determining 1524 may obtain an ACK or NAK (e.g., from the communication interface 1502, the memory device 1508, or some other component of the apparatus 1500). The circuit/module for determining 1524 may elect to retransmit if the feedback is a NAK or some other similar value. The circuit/module for determining 1524 may then output an indication of the determination (e.g., to the circuit/module for transmitting 1522, the memory device 1508, or some other component).

The circuit/module for generating CRC information 1526 may include circuitry and/or programming (e.g., code for generating CRC information 1536 stored on the storage medium 1504) adapted to perform several functions relating to, for example, generating CRC information for different subsets of bits. In some aspects, the circuit/module for generating CRC information 1526 (e.g., a means for generating) may correspond to, for example, a processing circuit.

In some aspects, the circuit/module for generating CRC information 1526 may perform a CRC algorithm based on obtained input information. The circuit/module for generating CRC information 1526 then outputs the resulting CRC (e.g., to the circuit/module for encoding 1520, the memory device 1508, the communication interface 1502, or some other component).

Fifth Example Process

Figure 16:
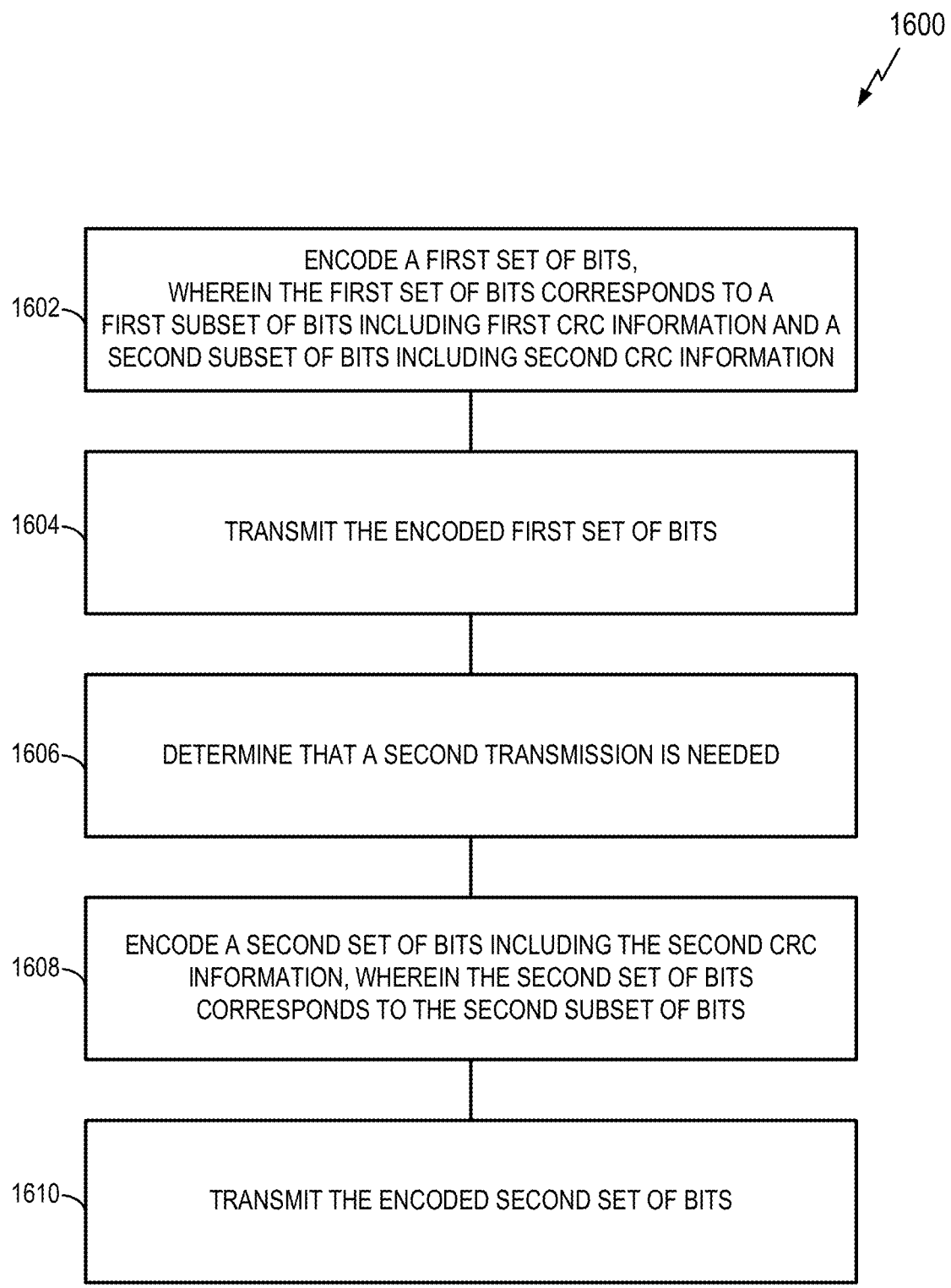
FIG. 16 is a flowchart illustrating an example of an encoding process in accordance with some aspects of the disclosure.

FIG. 16 illustrates a process 1600 for communication in accordance with some aspects of the disclosure. The process 1600 may take place within a processing circuit (e.g., the processing circuit 1510 of FIG. 15), which may be located in an access terminal, a base station, or some other suitable apparatus (e.g., that includes an encoder). Of course, in various aspects within the scope of the disclosure, the process 1600 may be implemented by any suitable apparatus capable of supporting signaling-related operations.

At block 1602, an apparatus (e.g., a device that includes an encoder) encodes a first set of bits, wherein the first set of bits corresponds to a first subset of bits including first CRC information and a second subset of bits including second CRC information. In some aspects, the encoding of the first set of bits may include Polar coding. In some aspects, the encoding of the first set of bits may include systematic encoding. In some aspects, the first CRC information may be independent of the second CRC information.

In some implementations, the circuit/module for encoding 1520 of FIG. 15 performs the operations of block 1602. In some implementations, the code for encoding 1530 of FIG. 15 is executed to perform the operations of block 1602.

At block 1604, the apparatus transmits the encoded first set of bits.

In some implementations, the circuit/module for transmitting 1522 of FIG. 15 performs the operations of block 1604. In some implementations, the code for transmitting 1532 of FIG. 15 is executed to perform the operations of block 1604.

At block 1606, the apparatus determines that a second transmission is needed.

In some implementations, the circuit/module for determining 1524 of FIG. 15 performs the operations of block 1606. In some implementations, the code for determining 1534 of FIG. 15 is executed to perform the operations of block 1606.

At block 1608, the apparatus encodes a second set of bits including the second CRC information, wherein the second set of bits corresponds to the second subset of bits.

In some implementations, the circuit/module for encoding 1520 of FIG. 15 performs the operations of block 1608. In some implementations, the code for encoding 1530 of FIG. 15 is executed to perform the operations of block 1608.

At block 1610, the apparatus transmits the encoded second set of bits.

In some implementations, the circuit/module for transmitting 1522 of FIG. 15 performs the operations of block 1610. In some implementations, the code for transmitting 1532 of FIG. 15 is executed to perform the operations of block 1610.

In some aspects, a process may include any combination of the aspects described above.

Example Encoder and Decoder

Figure 17:
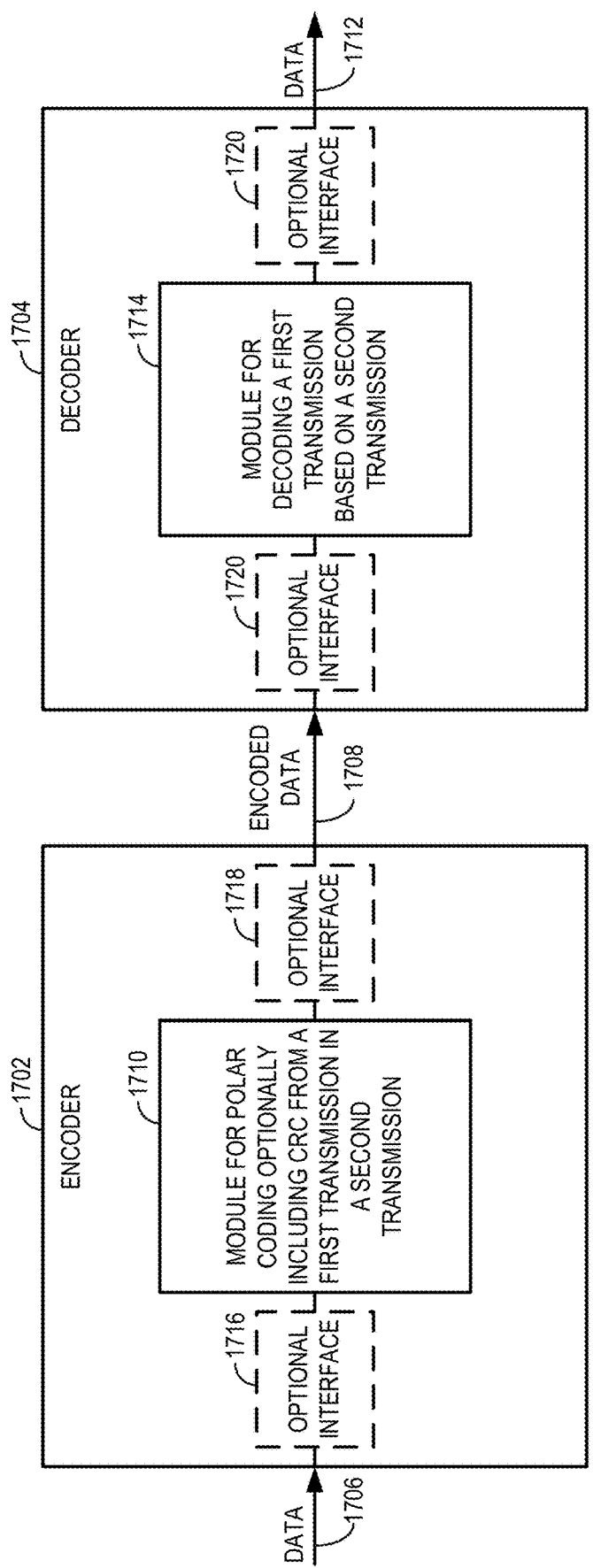
FIG. 17 is a block diagram of example encoder and decoder devices in accordance with some aspects of the disclosure.

FIG. 17 illustrates an example encoder 1702 and an example decoder 1704 constructed in accordance with the teachings herein. In some aspects, the encoder 1702 and the decoder 1704 may correspond to the encoder 212 and the decoder 214 of FIG. 2, respectively.

The encoder 1702 encodes data 1706 to generate encoded data 1708. In accordance with the teachings herein, the encoder 1702 may include a module for Polar coding optionally including CRC from a first transmission in a second transmission 1710.

The decoder 1704 decodes the encoded data 1708 (e.g., after transmission over a communication channel, not shown) to provide recovered data 1712. In accordance with the teachings herein, the decoder 1704 may include a module for decoding a first transmission based on a second transmission 1714.

In some implementations, the encoder 1702 may include an interface 1716, an interface 1718, or both. Such an interface may include, for example, an interface bus, bus drivers, bus receivers, other suitable circuitry, or a combination thereof. For example, the interface 1716 may include receiver devices, buffers, or other circuitry for receiving a signal. As another example, the interface 1718 may include output devices, drivers, or other circuitry for sending a signal. In some implementations, the interfaces 1716 and 1718 may be configured to interface one or more other components of the encoder 1702 (other components not shown in FIG. 17).

In some implementations, the decoder 1704 may include an interface 1720, an interface 1722, or both. Such an interface may include, for example, an interface bus, bus drivers, bus receivers, other suitable circuitry, or a combination thereof. For example, the interface 1720 may include receiver devices, buffers, or other circuitry for receiving a signal. As another example, the interface 1722 may include output devices, drivers, or other circuitry for sending a signal. In some implementations, the interfaces 1720 and 1722 may be configured to interface one or more other components of the decoder 1704 (other components not shown in FIG. 17).

The encoder 1702 and the decoder 1704 may take different forms in different implementations. In some cases, the encoder 1702 and/or the decoder 1704 may be an integrated circuit. In some cases, the encoder 1702 and/or the decoder 1704 may be included in an integrated circuit that includes other circuitry (e.g., a processor and related circuitry).

Additional Aspects

The examples set forth herein are provided to illustrate certain concepts of the disclosure. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

As those skilled in the art will readily appreciate, various aspects described throughout this disclosure may be extended to any suitable telecommunication system, network architecture, and communication standard. By way of example, various aspects may be applied to wide area networks, peer-to-peer network, local area network, other suitable systems, or any combination thereof, including those described by yet-to-be defined standards.

Many aspects are described in terms of sequences of actions to be performed by, for example, elements of a computing device. It will be recognized that various actions described herein can be performed by specific circuits, for example, central processing units (CPUs), graphic processing units (GPUs), digital signal processors (DSPs), application specific integrated circuits (ASICs), field programmable gate arrays (FPGAs), or various other types of general purpose or special purpose processors or circuits, by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

One or more of the components, steps, features and/or functions illustrated in above may be rearranged and/or combined into a single component, step, feature or function or embodied in several components, steps, or functions. Additional elements, components, steps, and/or functions may also be added without departing from novel features disclosed herein. The apparatus, devices, and/or components illustrated above may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of example processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An example of a storage medium is coupled to the processor such that the processor can read information from, and write information to, the storage medium. In the alternative, the storage medium may be integral to the processor.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

The terminology used herein is for the purpose of describing particular aspects only and is not intended to be limiting of the aspects. As used herein, the singular forms "a," "an" and "the" are intended to include the plural forms as well, unless the context clearly indicates otherwise. It will be further understood that the terms "comprises," "comprising," "includes" or "including," when used herein, specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may comprise one or more elements. In addition, terminology of the form "at least one of a, b, or c" or "a, b, or c, or any combination thereof" used in the description or the claims means "a or b or c or any combination of these elements." For example, this terminology may include a, or b, or c, or a and b, or a and c, or a and b and c, or 2a, or 2b, or 2c, or 2a and b, and so on.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

While the foregoing disclosure shows illustrative aspects, it should be noted that various changes and modifications could be made herein without departing from the scope of the appended claims. The functions, steps or actions of the method claims in accordance with aspects described herein need not be performed in any particular order unless expressly stated otherwise. Furthermore, although elements may be described or claimed in the singular, the plural is contemplated unless limitation to the singular is explicitly stated.

What is claimed is:

1. A method of communication, comprising:
   decoding a first transmission comprising a first set of bits, wherein the first set of bits includes cyclic redundancy check information, a first subset of bits and a second subset of bits, and wherein the first subset of bits is encoded on a first set of Polar code sub-channels associated with a first Polar code sub-channel quality and the second subset of bits is encoded on a second set of Polar code sub-channels associated with a second Polar code sub-channel quality that is lower than the first Polar code sub-channel quality;
   receiving a second transmission associated with the first transmission, wherein the second transmission comprises a second set of bits without any cyclic redundancy check information, and the second set of bits corresponds to the second subset of bits;
   decoding the second set of bits to provide a decoded second set of bits; and
   decoding the first set of bits using the decoded second set of bits.

2. The method of claim 1, wherein:
   the decoding of the first transmission includes decoding the second subset of bits; and
   the decoding of the first set of bits using the decoded second set of bits comprises using candidate vectors from the decoding of the second set of bits instead of candidate vectors from the decoding of the second subset of bits.

3. The method of claim 1, wherein:
   the decoding of the first transmission includes generating a decoded second subset of bits; and
   the decoding of the first set of bits using the decoded second set of bits comprises:
      soft-combining the decoded second subset of bits and the decoded second set of bits to generate soft-combined bits, and
      recovering the first set of bits based on the soft-combined bits.

4. The method of claim 3, wherein:
   the soft-combining comprises generating candidate vectors; and
   the decoding of the first set of bits using the decoded second set of bits is based on the candidate vectors.

5. The method of claim 1, wherein the first set of bits and the second set of bits are systematic coded bits.

6. The method of claim 1, wherein the first set of bits and the second set of bits are Polar coded bits.

7. The method of claim 1, wherein the decoding of the first set of bits using the decoded second set of bits comprises list decoding.

8. An apparatus for communication comprising:
   a memory; and
   a processor coupled to the memory, the processor and the memory configured to:
      decode a first transmission comprising a first set of bits, wherein the first set of bits includes cyclic redundancy check information, a first subset of bits, and a second subset of bits, and wherein the first subset of bits is encoded on a first set of Polar code sub-channels associated with a first Polar code sub-channel quality and the second subset of bits is encoded on a second set of Polar code sub-channels associated with a second Polar code sub-channel quality that is lower than the first Polar code sub-channel quality;
      receive a second transmission associated with the first transmission, wherein the second transmission comprises a second set of bits without any cyclic redundancy check information, and the second set of bits corresponds to the second subset of bits;
      decode the second set of bits to provide a decoded second set of bits; and
      decode the first set of bits using the decoded second set of bits.

9. The apparatus of claim 8, wherein:
   the decode of the first transmission includes a decode of the second subset of bits; and
   the decode of the first set of bits using the decoded second set of bits comprises using candidate vectors from the decode of the second set of bits instead of candidate vectors from the decode of the second subset of bits.

10. The apparatus of claim 8, wherein:
    the decode of the first transmission includes a generation of a decoded second subset of bits; and
    the decode of the first set of bits using the decoded second set of bits comprises:
       a soft-combination of the decoded second subset of bits and the decoded second set of bits to generate soft-combined bits, and
       a recovery of the first set of bits based on the soft-combined bits.

11. The apparatus of claim 10, wherein:
    the soft-combination comprises a generation of candidate vectors; and
    the decode of the first set of bits using the decoded second set of bits is based on the candidate vectors.

12. The apparatus of claim 8, wherein the first set of bits and the second set of bits are systematic coded bits.

13. The apparatus of claim 8, wherein the first set of bits and the second set of bits are Polar coded bits.

14. The apparatus of claim 8, wherein the decode of the first set of bits using the decoded second set of bits comprises a list decode.

15. An apparatus for communication comprising:
    means for decoding a first transmission comprising a first set of bits, wherein the first set of bits includes cyclic redundancy check information, a first subset of bits and a second subset of bits, and wherein the first subset of bits is encoded on a first set of Polar code sub-channels associated with a first Polar code sub-channel quality and the second subset of bits is encoded on a second set of Polar code sub-channels associated with a second Polar code sub-channel quality that is lower than the first Polar code sub-channel quality;
    means for receiving a second transmission associated with the first transmission, wherein the second transmission comprises a second set of bits without any cyclic redundancy check information, and the second set of bits corresponds to the second subset of bits,
    wherein the means for decoding is configured for decoding the second set of bits to provide a decoded second set of bits and for decoding the first set of bits using the decoded second set of bits.

16. The apparatus of claim 15, wherein:
    the decoding of the first transmission includes decoding the second subset of bits; and
    the decoding of the first set of bits using the decoded second set of bits comprises using candidate vectors from the decoding of the second set of bits instead of candidate vectors from the decoding of the second subset of bits.

17. The apparatus of claim 15, wherein:
    the decoding of the first transmission includes generating a decoded second subset of bits; and the decoding of the first set of bits using the decoded second set of bits comprises:
  soft-combining the decoded second subset of bits and the decoded second set of bits to generate soft-combined bits, and
  recovering the first set of bits based on the soft-combined bits.

18. The apparatus of claim 17, wherein:
the soft-combining comprises generating candidate vectors; and
the decoding of the first set of bits using the decoded second set of bits is based on the candidate vectors.

19. The apparatus of claim 15, wherein the first set of bits and the second set of bits are systematic coded bits.

20. The apparatus of claim 15, wherein the first set of bits and the second set of bits are Polar coded bits.

21. The apparatus of claim 15, wherein the decoding of the first set of bits using the decoded second set of bits comprises list decoding.

22. A non-transitory computer-readable medium storing computer-executable code, including code to:

decode a first transmission comprising a first set of bits, wherein the first set of bits includes cyclic redundancy check information, a first subset of bits and a second subset of bits, and wherein the first subset of bits is encoded on a first set of Polar code sub-channels associated with a first Polar code sub-channel quality and the second subset of bits is encoded on a second set of Polar code sub-channels associated with a second Polar code sub-channel quality that is lower than the first Polar code sub-channel quality;

receive a second transmission associated with the first transmission, wherein the second transmission comprises a second set of bits without any cyclic redundancy check information, and the second set of bits corresponds to the second subset of bits;

decode the second set of bits to provide a decoded second set of bits; and decode the first set of bits using the decoded second set of bits.

* * * * *